United States Patent
Nagahisa et al.

(10) Patent No.: US 10,991,822 B2
(45) Date of Patent: Apr. 27, 2021

(54) SILICON CARBIDE SEMICONDUCTOR DEVICE HAVING A CONDUCTIVE LAYER FORMED ABOVE A BOTTOM SURFACE OF A WELL REGION SO AS NOT TO BE IN OHMIC CONNECTION WITH THE WELL REGION AND POWER CONVERTER INCLUDING THE SAME

(71) Applicant: Mitsubishi Electric Corporation, Chiyoda-ku (JP)

(72) Inventors: Yuichi Nagahisa, Tokyo (JP); Shiro Hino, Tokyo (JP); Koji Sadamatsu, Tokyo (JP); Hideyuki Hatta, Tokyo (JP); Kotaro Kawahara, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 16/477,119

(22) PCT Filed: Feb. 22, 2018

(86) PCT No.: PCT/JP2018/006494
§ 371 (c)(1),
(2) Date: Jul. 10, 2019

(87) PCT Pub. No.: WO2018/155566
PCT Pub. Date: Aug. 30, 2018

(65) Prior Publication Data
US 2019/0371936 A1    Dec. 5, 2019

(30) Foreign Application Priority Data
Feb. 24, 2017    (JP) .............................. JP2017-033097

(51) Int. Cl.
*H01L 29/78*    (2006.01)
*H01L 29/16*    (2006.01)
(Continued)

(52) U.S. Cl.
CPC ...... *H01L 29/7806* (2013.01); *H01L 21/8234* (2013.01); *H01L 27/06* (2013.01);
(Continued)

(58) Field of Classification Search
CPC ............. H01L 29/7804; H01L 29/7806; H01L 29/7811; H01L 29/1608
See application file for complete search history.

(56) References Cited

U.S. PATENT DOCUMENTS

2006/0131645 A1    6/2006    Kaneko
2009/0078992 A1    3/2009    Kaneko
(Continued)

FOREIGN PATENT DOCUMENTS

JP    61-15370 A    1/1986
JP    3-229469 A    10/1991
(Continued)

OTHER PUBLICATIONS

U.S. Appl. No. 16/477,099, filed Jul. 10, 2019, Hideyuki Hatta, et al.
(Continued)

*Primary Examiner* — Younes Boulghassoul
(74) *Attorney, Agent, or Firm* — Xsensus LLP

(57) ABSTRACT

In an SiC-MOSFET with a built-in Schottky diode, a bipolar current may be passed in a second well region formed at a terminal part to reduce a breakdown voltage. In the SiC-MOSFET with the built-in Schottky diode, a conductive layer in Schottky connection with the second well region is provided on the second well region in the terminal part, and the conductive layer is electrically connected with a source electrode of the MOSFET. A conductive layer contact hole is provided for connecting only the conductive layer and the source electrode.

20 Claims, 14 Drawing Sheets

(51) Int. Cl.
    *H01L 29/417*     (2006.01)
    *H01L 29/47*     (2006.01)
    *H01L 29/06*     (2006.01)
    *H01L 27/06*     (2006.01)
    *H02P 27/08*     (2006.01)
    *H01L 29/872*     (2006.01)
    *H01L 21/8234*     (2006.01)
    *H02M 7/5387*     (2007.01)

(52) U.S. Cl.
CPC ...... *H01L 29/0619* (2013.01); *H01L 29/0696* (2013.01); *H01L 29/1608* (2013.01); *H01L 29/41741* (2013.01); *H01L 29/47* (2013.01); *H01L 29/7804* (2013.01); *H01L 29/7811* (2013.01); *H02M 7/53871* (2013.01); *H01L 29/872* (2013.01); *H02P 27/08* (2013.01)

(56) References Cited

U.S. PATENT DOCUMENTS

| | | | |
|---|---|---|---|
| 2011/0278599 A1* | 11/2011 | Nakao | H01L 29/1095 257/77 |
| 2013/0107600 A1 | 5/2013 | Hayashi et al. | |
| 2014/0225114 A1* | 8/2014 | Furukawa | H01L 27/0296 257/48 |
| 2014/0252378 A1 | 9/2014 | Ota et al. | |
| 2014/0299888 A1 | 10/2014 | Nakao et al. | |
| 2015/0236012 A1 | 8/2015 | Hino et al. | |
| 2016/0079411 A1* | 3/2016 | Hino | H01L 29/47 257/77 |
| 2018/0097103 A1* | 4/2018 | Sadamatsu | H01L 22/14 |
| 2018/0277437 A1* | 9/2018 | Yamada | H01L 29/1608 |
| 2019/0131443 A1* | 5/2019 | Hoshi | H01L 29/4238 |
| 2019/0181259 A1* | 6/2019 | Hino | H01L 27/04 |
| 2019/0371935 A1* | 12/2019 | Hatta | H01L 29/872 |

FOREIGN PATENT DOCUMENTS

| | | |
|---|---|---|
| JP | 2003-17701 A | 1/2003 |
| JP | 2006-140372 A | 6/2006 |
| JP | 2009-76761 A | 4/2009 |
| JP | 2014-175412 A | 9/2014 |
| WO | WO 2010/098294 A1 | 9/2010 |
| WO | WO 2013/051170 A1 | 4/2013 |
| WO | WO 2014/038110 A1 | 3/2014 |
| WO | WO 2014/162969 A1 | 10/2014 |

OTHER PUBLICATIONS

International Search Report dated May 22, 2018 in PCT/JP2018/006494 filed on Feb. 22, 2018.

* cited by examiner

F I G. 6
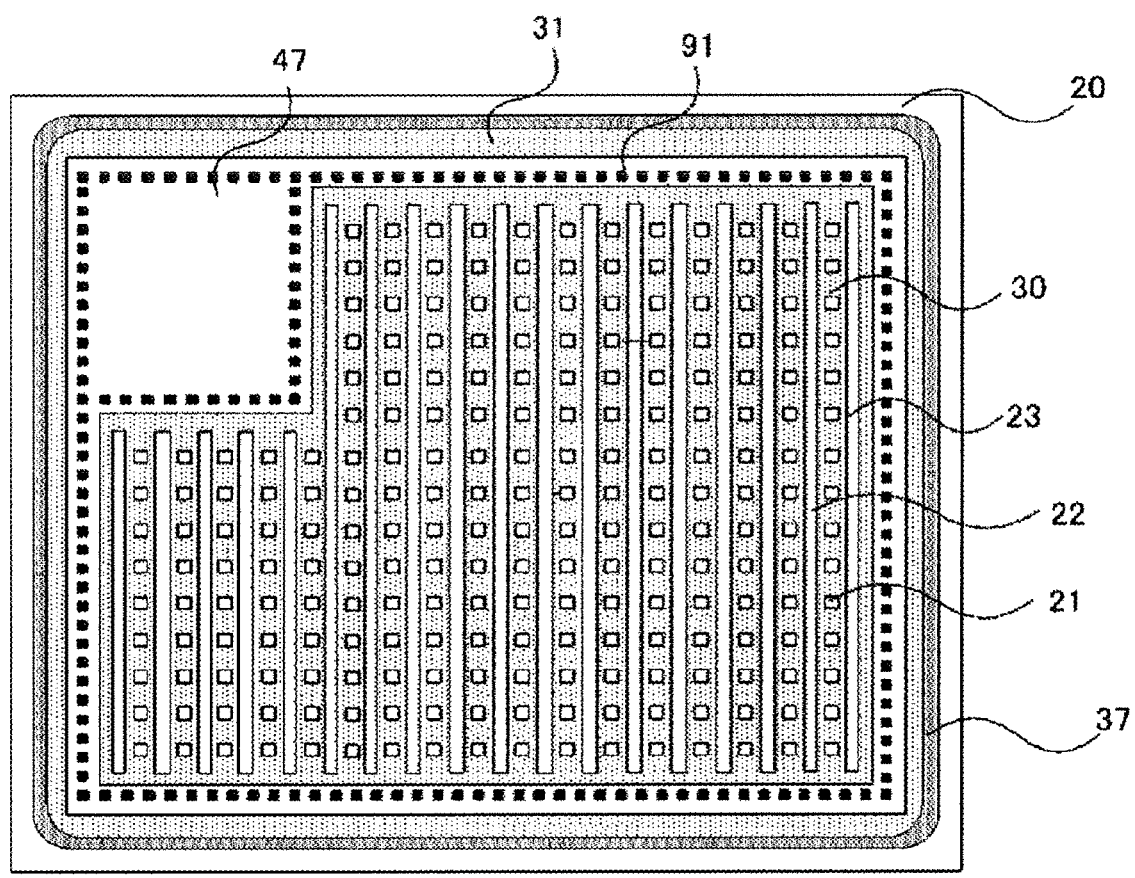

SILICON CARBIDE SEMICONDUCTOR DEVICE HAVING A CONDUCTIVE LAYER FORMED ABOVE A BOTTOM SURFACE OF A WELL REGION SO AS NOT TO BE IN OHMIC CONNECTION WITH THE WELL REGION AND POWER CONVERTER INCLUDING THE SAME

TECHNICAL FIELD

The present invention relates to a silicon carbide semiconductor device made of silicon carbide and a power converter.

BACKGROUND ART

Regarding a PN diode configured using silicon carbide (SiC), flowing a forward current, specifically, a bipolar current continuously is known to result in a problem in terms of reliability that stacking fault is caused in crystal to cause the forward voltage to shift. This is considered to result from the extension of the stacking fault as plane defect from basal plane dislocation as a starting point existing in a silicon carbide substrate, for example, caused by rebinding energy produced when minority carriers injected through the PN diode are recombined with majority carriers. This stacking fault prohibits a current flow. Hence, the extension of the stacking fault reduces current and increases the forward voltage, causing reliability reduction of a semiconductor device.

Such increase in the forward voltage also occurs in a similar way in a vertical metal oxide semiconductor field effect transistor (MOSFET) using silicon carbide. The vertical MOSFET includes a parasitic PN diode (body diode) between a source and a drain. If a forward current flows in the body diode, the vertical MOSFET also suffers from reliability reduction similar to that occurring in the PN diode. If the body diode of the SiC-MOSFET is used as a free-wheeling diode of an MOSFET, the characteristics of this MOSFET may be degraded.

There is one method of solving the foregoing problem in terms of reliability caused by the passage of the forward current in the parasitic PN diode. As shown in patent document 1, according to this method, stress of causing a forward current to flow for a long time in the parasitic PN diode is applied, change is measured between a forward voltage before the stress application and a forward voltage after the stress application, and an element with large change in the forward voltage is eliminated (screen out) from products. However, this method has disadvantages that time of current passage is extended, and using a wafer with many defects results in the occurrence of many defective items.

There is also a different method by which a unipolar diode is provided and used as a free-wheeling diode in a semiconductor device as a unipolar transistor such as an MOSFET. For example, patent documents 2 and 3 each describe a method of providing a Schottky barrier diode (SBD) as a unipolar diode in a unit cell of an MOSFET.

If such a unipolar transistor, specifically, a unipolar transistor including a diode to pass a current only with majority carriers provided in an active region is applied to a silicon carbide semiconductor device, designing a diffusion potential at the unipolar transistor, specifically, a voltage for starting current passage to be lower than a diffusion potential at a PN junction prevents flow of a bipolar current in the body diode during free-wheeling operation. By doing so, it becomes possible to suppress characteristic degradation of the unipolar transistor in the active region.

In an MOSFET described in patent document 4, for example, an n-type channel epitaxial layer is formed on a p-type well region forming an active region, the channel epitaxial layer operates as a unipolar diode at a gate voltage being a threshold voltage or less, and the start-up voltage of the unipolar diode is designed to be lower than the operating voltage of a pn diode formed from the p-type well region and an n-type drift layer. This MOSFET is expected to achieve effect comparable to that achieved by an MOSFET with a built-in SBD. This MOSFET can be considered as one type of unipolar transistor including a unipolar diode provided in an active region.

Even in the unipolar transistor with the unipolar diode provided in the active region, however, formation of a parasitic PN diode is still unavoidable in some cases in a part where the unipolar diode is hard to locate for reason of a structure in a terminal region, namely, a region other than the active region.

For example, a terminal well region protruding further outwardly than a source electrode is formed in a region near a gate pad or near a semiconductor device terminal part, and a parasitic PN diode is formed between the terminal well region and a drift layer. In this part, a Schottky electrode is not formed and a unipolar diode is not formed. By the absence of a Schottky electrode in the terminal well region, a voltage between a source electrode and a drain electrode is applied to the PN diode formed from the terminal well region and the drift layer, thereby causing a bipolar current to flow in the PN diode.

If a starting point such as basal plane dislocation exists in this part, stacking fault is extended, unfortunately reducing the breakdown voltage of a transistor. More specifically, a leakage current may occur when the transistor is in an OFF state, and heat generated from the leakage current may destroy an element or a circuit.

This problem may be avoided by preventing flow of a bipolar current in the pn diode formed from the terminal well region and the drift layer, for example, by limiting a voltage applied between a source and a drain to a certain value or less during operation of a semiconductor device. To achieve this, a chip size may be increased and the differential resistance of an built-in SBD per chip may be reduced, thereby reducing a source-to-drain voltage generated at the time of flow of a free-wheeling current. However, this causes a disadvantage as it increases the chip size and increases cost.

The forward operation of the PN diode formed from the terminal well region and the drift layer may be suppressed without increasing the chip size by a method of increasing a resistance at a current passage path formed between each part in the terminal well region and a source electrode. A resistance at the current passage path may be increased by a method of increasing a contact resistance between the terminal well region and the source electrode (patent document 5, for example). In such a structure, when a bipolar current flows in the PN diode formed from the terminal well region and the drift layer, voltage drop develops as a result of a resistance component in a contact resistance to produce a difference of a potential at the terminal well region from a source potential. This generates corresponding reduction in a forward voltage applied to the PN diode. In this way, it becomes possible to suppress passage of a bipolar current.

There is a phenomenon known to occur particularly notably in a device made of a wide-gap semiconductor represented by silicon carbide. In this phenomenon, an element may be destroyed by a displacement current flowing in the well region during switching. When a silicon carbide semiconductor device having an MOS structure is switched, a displacement current flows in a plane direction in a relatively wide p-type well region. This displacement current and a sheet resistance in the well region cause a high voltage in the well region. This causes insulation breakdown of an insulating film between the insulating film and an electrode formed over the well region across an insulating film to destroy the element. If a potential at the well region is changed to 50 V or more and if a gate electrode at a potential of substantially 0 V is formed on the well region across a silicon oxide film, for example, a high electric field such as 10 MV/cm is applied to the silicon oxide film to result in unintentional insulation breakdown of the silicon oxide film.

This phenomenon occurs notably in a device made of a wide-gap semiconductor represented by silicon carbide for the following two reasons.

A first reason is that, as a p-type well region formed in a wide-gap semiconductor such as silicon carbide has a deeper impurity level than a p-type well region formed in silicon, a sheet resistance in the p-type well region of the wide-gap semiconductor becomes significantly higher than that in the p-type well region of silicon.

The other reason is that, as a low-resistance n-type drift layer having a high impurity concentration is used in a wide-gap semiconductor by taking advantage of the insulation breakdown field of the wide-gap semiconductor higher than that of a silicon semiconductor, the capacity of a depletion layer formed at a pn junction between the n-type drift layer and the p-type well region becomes significantly larger in the wide-gap semiconductor than in silicon. As a result, a large displacement current flows during switching.

As a switching speed becomes higher, a displacement current becomes larger and a voltage generated in the well region also becomes larger. The voltage resulting from the displacement current is reduced by a suggested method of forming a low-resistance p-type layer in a part of the p-type well region (patent document 6, for example).

PRIOR ART DOCUMENTS

Patent Documents

Patent document 1: Japanese Patent Application Laid-Open No. 2014-175412
Patent document 2: Japanese Patent Application Laid-Open No. 2003-017701
Patent document 3: Publication of International Application No. WO 2014-038110
Patent document 4: Publication of International Application No. WO 2013-051170
Patent document 5: Publication of International Application No. WO 2014-162969
Patent document 6: Publication of International Application No. WO 2010-098294

SUMMARY

Problem to be Solved by the Invention

As described above, there have been the problems as follows: a problem of giving priority to increasing a plane direction resistance in a terminal well region in order to suppress passage of a bipolar current during free-wheeling operation in the terminal well region; and a problem of giving priority to reducing a plane direction resistance in a wide well region such as a terminal well region in order to reduce a voltage generated by a displacement current to flow in the well region during switching. As a result of these problems as tradeoffs, there has not been a known method of achieving both the problems of reducing a bipolar current during free-wheeling operation and preventing destroy of an element during switching.

The present invention has been made to solve the foregoing problems, and is intended to provide a silicon carbide semiconductor device with improved reliability achieving reduction in a bipolar current during free-wheeling operation and reducing the occurrence of destroy of an element during switching.

Means to Solve the Problem

A silicon carbide semiconductor device according to the present invention includes: a semiconductor substrate of a first conductivity type made of silicon carbide; a drift layer of the first conductivity type formed on the semiconductor substrate; a first well region of a second conductivity type provided in a surface layer of the drift layer; a first separation region of the first conductivity type penetrating the first well region in a depth direction from a surface of the first well region; a source region of the first conductivity type formed in a surface layer area of the first well region; a first Schottky electrode provided on the first separation region and forming a Schottky junction with the first separation region; an ohmic electrode provided on the first well region and in ohmic connection with the first well region; a gate insulating film formed on the first well region; a second well region of the second conductivity type provided in the surface layer of the drift layer separately from the first well region; a gate electrode formed on the gate insulating film on the first well region and on an insulating film provided on the second well region; a gate pad formed above the second well region and connected with the gate electrode; a conductive layer formed above the bottom surface of the second well region so as not to be in ohmic connection with the second well region, the conductive layer being lower in sheet resistance than the second well region; a source electrode connected with the first Schottky electrode, the ohmic electrode, and the conductive layer; and a conductive layer contact hole forming ohmic connection between the conductive layer and the source electrode, while forming no ohmic connection between the conductive layer and the second well region.

Effects of the Invention

The silicon carbide semiconductor device according to the present invention is capable of reducing a bipolar current during free-wheeling operation, reducing the occurrence of destroy of an element during switching, and improving the reliability of the element.

BRIEF DESCRIPTION OF DRAWINGS

FIG. 6 is a schematic plan view of the silicon carbide semiconductor device according to the first embodiment of the invention having a different structure;

DESCRIPTION OF EMBODIMENT(S)

Figure 1:
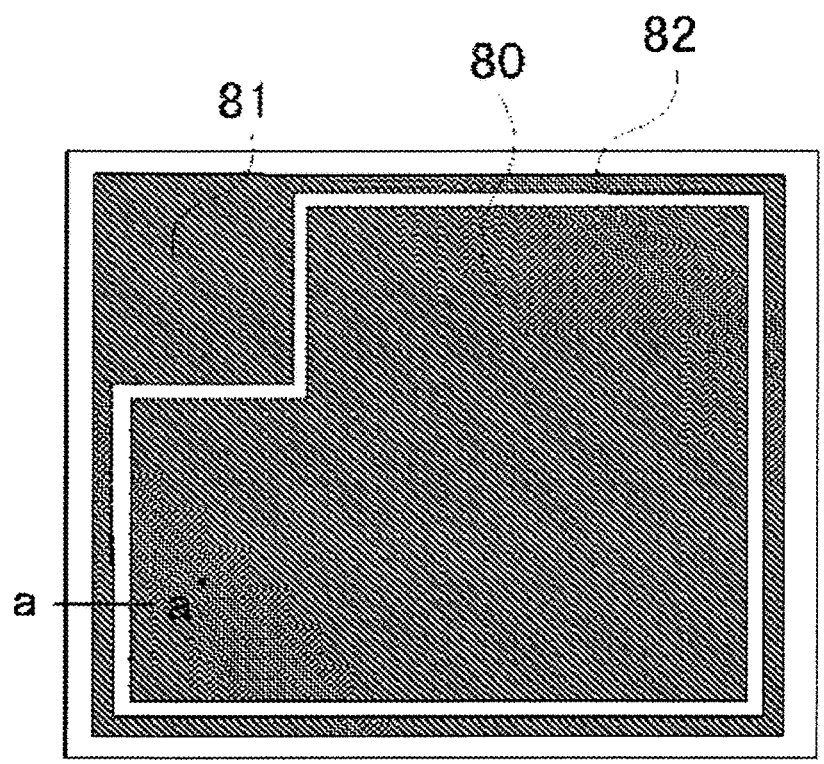
FIG. 1 is a schematic plan view of a silicon carbide semiconductor device taken from above according to a first embodiment of the invention.

Embodiments will be described below by referring to the accompanying drawings. The drawings are drawn schematically. Correlations in terms of size and position between images shown in different drawings are not always illustrated correctly but can be changed, where appropriate. In the following description, comparable constituting elements are given the same sign and shown with the same sign in the drawings. The names and functions of such constituting elements are correlated to each other in the same way. Thus, in some cases, detailed description of such constituting elements will be omitted.

In embodiments described in this description, a silicon carbide (SiC) semiconductor device is given as an example of a semiconductor device, and an n-channel silicon carbide MOSFET having an n type as a first conductivity type and a p type as a second conductivity type is described as an example. Statement about a potential level is based on the assumption that the first conductivity type is the n type and the second conductivity type is the p type. If the first conductivity type is the p type and the second conductivity type is the n type, statement about a potential level is to be considered in an opposite way.

In this application, a region belonging to the semiconductor device entirely and other than an active region where unit cells are aligned cyclically will be called a terminal region and described with this name.

First Embodiment

The structure of a silicon carbide semiconductor device according to a first embodiment of the present invention will be described first.

FIG. 1 is a schematic plan view of a silicon carbide MOSFET with a built-in Schottky diode (SBD) (SiC-MOSFET with built-in SBD) as the silicon carbide semiconductor device taken from above according to the first embodiment. In FIG. 1, a gate pad 81 is formed in a part of the upper surface of the SiC-MOSFET, and a source electrode 80 is formed adjacent to the gate pad 81. A gate line 82 is formed to extend from the gate pad 81.

Figure 2:
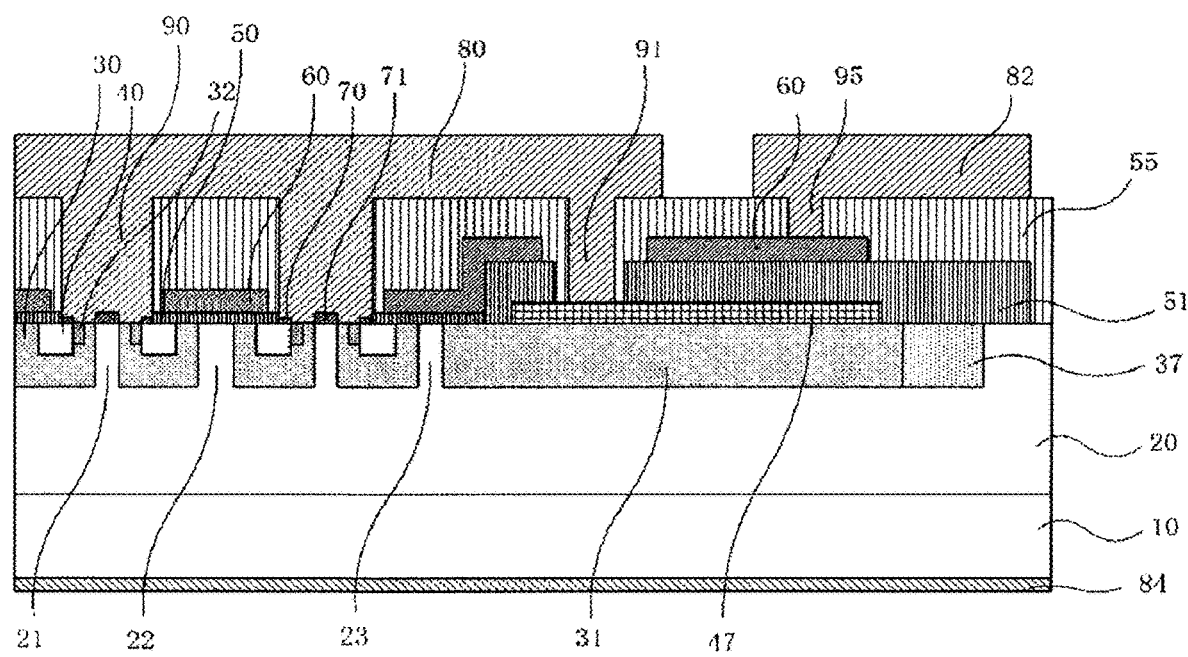
FIG. 2 is a schematic sectional view of the silicon carbide semiconductor device according to the first embodiment of the invention.
Figure 3:
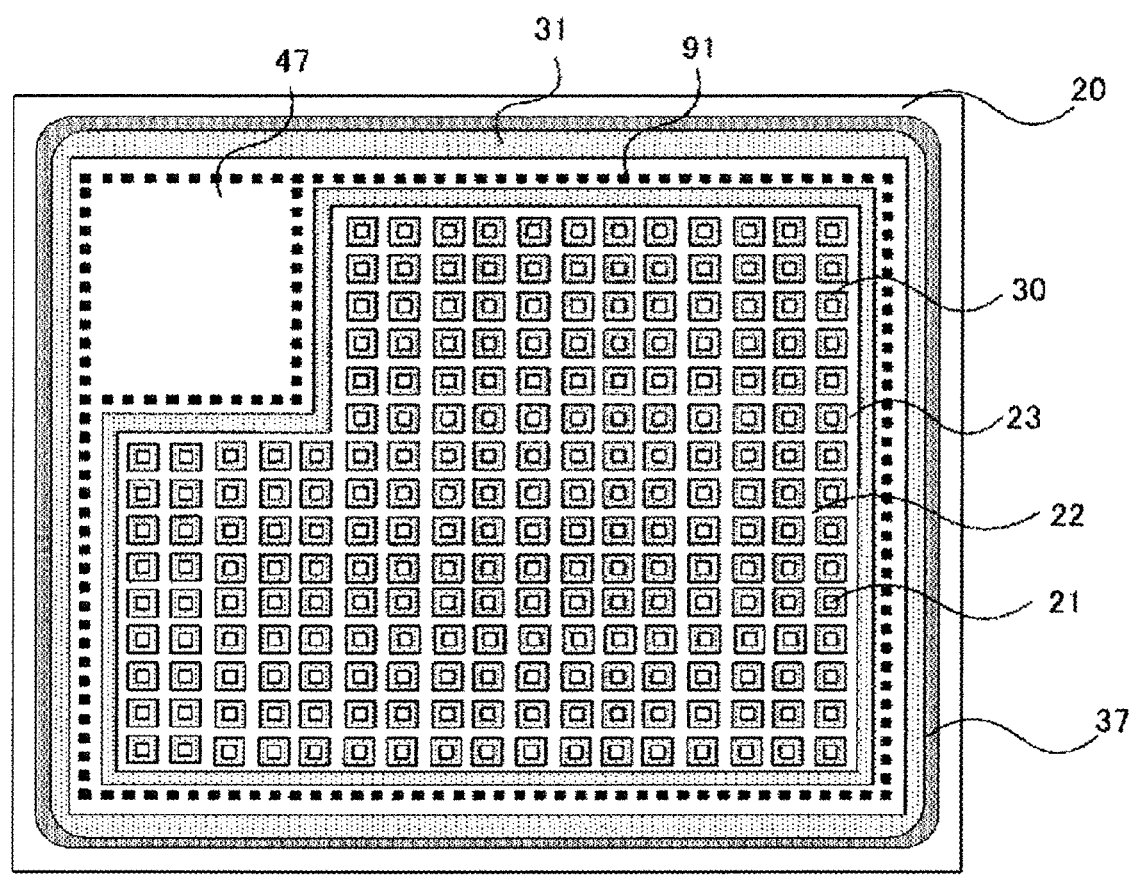
FIG. 3 is a schematic plan view of the silicon carbide semiconductor device according to the first embodiment of the invention.

FIG. 2 is a schematic sectional view schematically showing a cross section in a part a-a' of FIG. 1 from the source electrode 80 to the gate line 82 in an outer peripheral part of the silicon carbide semiconductor device. FIG. 3 is a schematic plan view mainly showing a part corresponding to silicon carbide semiconductor in the top view of FIG. 1.

In FIG. 2, a drift layer 20 made of n-type silicon carbide is formed on a surface of a semiconductor substrate 10 made of n-type and low-resistance silicon carbide. As shown in FIG. 3, a second well region 31 made of p-type silicon carbide is formed in a surface layer area of the drift layer 20 at a position substantially corresponding to a region where the gate line 82 described by referring to FIG. 1 is provided.

Multiple first well regions 30 made of p-type silicon carbide are provided in the surface layer area of the drift layer 20 and below a region where the source electrode 80 described by referring to FIG. 1 is provided. Each of the first well regions 30 has a surface layer area where a source region 40 made of n-type silicon carbide is formed at a position separated inwardly by a predetermined gap from the outer periphery of the first well region 30.

A contact region 32 made of low-resistance p-type silicon carbide is formed in the surface layer area of the first well region 30 at a position further separated inwardly from the source region 40 in the surface layer area of each first well region 30. A first separation region 21 made of silicon carbide and penetrating the first well region 30 is formed still inside the contact region 32. Like the drift layer 20, the first separation region 21 has the n type. The first separation region 21 has an n-type impurity concentration that can be the same as an n-type impurity concentration in the drift layer 20, or higher or lower than the n-type impurity concentration in the drift layer 20.

A first Schottky electrode 71 in Schottky connection with the first separation region 21 is formed on a surface of the first separation region 21. The first Schottky electrode 71 is desirably formed to include at least the corresponding first separation region 21 when viewed from above.

An ohmic electrode 70 is formed on a surface of the source region 40. The source electrode 80 connected with the ohmic electrode 70, the first Schottky electrode 71, and the contact region 32 is formed on the ohmic electrode 70, the first Schottky electrode 71, and the contact region 32. The first well region 30 can transfer and receive electrons and holes easily to and from the ohmic electrode 70 through the low-resistance contact region 32.

A region in the drift layer 20 between adjacent ones of the first well regions 30 functions as an n-type second separation region 22. The second separation region 22 has an n-type impurity concentration that can be the same as the n-type impurity concentration in the drift layer 20, or higher or lower than the n-type impurity concentration in the drift layer 20. A gate insulating film 50 is formed on surfaces of the adjacent first well regions 30, a surface of the second separation region 22 between the adjacent first well regions 30, and a surface of the source region 40 in each first well region 30. A gate electrode 60 is formed on the gate insulating film 50 that at least above the first well region 30. The surface layer area of the first well region 30 below a part where the gate electrode 60 is formed and facing the gate electrode 60 across the gate insulating film 50 will be called a channel region.

The second well region 31 is formed outside the first well region 30 at the outermost periphery of the silicon carbide semiconductor device. A third separation region 23 is formed between the first well region 30 and the second well region 31. Like the drift layer 20, the third separation region 23 has the n type. The third separation region 23 has an n-type impurity concentration that can be the same as the n-type impurity concentration in the drift layer 20, or higher or lower than the n-type impurity concentration in the drift layer 20.

The gate insulating film 50 is further formed on the second well region 31. A gate electrode 60 electrically connected with the gate electrode 60 on the first well region 30 is formed above this gate insulating film 50.

A conductive layer 47 is formed in a large part of a region on a surface of the second well region 31. The conductive layer 47 is made of a material having a lower sheet resistance than the second well region 31 and not forming ohmic connection with the p-type second well region 31. The conductive layer 47 is formed to extend over a width corresponding to a half or more of the width of the second well region 31 in a lateral direction in a cross section. The part where the conductive layer 47 extends over a width corresponding to a half or more of the width of the second well region 31 in a lateral direction in a cross section is not required to extend in a total cross section but it can extend only in a partial cross section.

For example, the conductive layer 47 may be made of a polycrystalline silicon material having a thickness in a range from 50 to 1000 nm.

The conductivity type of the conductive layer 47 made of polycrystalline silicon may be the n-type or the p-type. Here, it is described as the n type. Independently of whether the conductive layer 47 made of polycrystalline silicon is the n type or the p type, the conductive layer 47 will be called a layer in Schottky connection with the second well region 31 made of 4H-SiC.

The reason for this is that, as an energy level in a valance band of silicon carbide is deeper than that of silicon, making silicon carbide and polycrystalline silicon contact each other produces a barrier height of the valance band of silicon carbide greater than that of carriers (carriers including both electrons and holes) in polycrystalline silicon.

In this case, if a voltage equal to or higher than a diffusion potential at a Schottky connection between the second well region 31 and the conductive layer 47 is applied to this Schottky connection, holes as majority carriers in the second well region 31 become movable to the source electrode 80. Conversely, injection of holes as majority carriers in the second well region 31 from the source electrode 80 toward the second well region 31 through the conductive layer 47 can be blocked.

An interlayer insulating film 55 is formed between the gate electrode 60 and the source electrode 80. The gate electrode 60 and the gate line 82 above the second well region 31 are connected with each other through a gate contact hole 95 formed in the interlayer insulating film 55. A p-type JTE region 37 made of silicon carbide is formed on the outer periphery of the second well region 31, specifically, on the opposite side of the first well region 30. The JTE region 37 has a lower impurity concentration than the second well region 31.

A field insulating film 51 having a larger thickness than the gate insulating film 50 or the gate insulating film 50 is formed on the second well region 31 and on the conductive layer 47 on the second well region 31. The gate insulating film 50 or the field insulating film 51 on a surface of the conductive layer 47 is partially given an opening, specifically, a conductive layer contact hole 91. The conductive layer 47 is in ohmic connection through this opening with the source electrode 80 formed above the conductive layer 47. The conductive layer contact hole 91 further penetrates the interlayer insulating film 55, thereby forming ohmic connection between the conductive layer 47 and the source electrode 80, while forming no connection between the conductive layer 47 and the second well region 31. The conductive layer 47 has an area greater than the diameter of the conductive layer contact hole 91.

The second well region 31 is not in direct ohmic connection with the source electrode 80.

In an active region, the source electrode 80 on the ohmic electrode 70, on the first Schottky electrode 71, and on the contact region 32 is connected with the source electrode 80 on the interlayer insulating film 55 through a first well region contact hole 90 penetrating the interlayer insulating film 55 and the gate insulating film 50.

A drain electrode 84 is formed on the back surface of the semiconductor substrate 10.

Next, a method of manufacturing the SiC-MOSFET with built-in SBD as the silicon carbide semiconductor device of this embodiment will be described.

First, the drift layer 20 made of silicon carbide having an impurity concentration from $1\times10^{15}$ to $1\times10^{17}$ cm$^{-3}$, n-type, and a thickness from 5 to 50 μm is epitaxially grown by chemical vapor deposition process (CVD process) on the semiconductor substrate 10 having a first main surface of a plane direction (0001) with an off angle and 4H polytype, and made of n-type and low-resistance silicon carbide.

Next, an implantation mask is formed using a photoresist, for example, in a predetermined region on the surface of the drift layer 20, and aluminum (Al) as p-type impurities is ion-implanted. At this time, the depth of the ion implantation with Al is set in a range from about 0.5 to about 3 μm not exceeding the thickness of the drift layer 20. The impurity concentration of the ion-implanted Al is in a range from $1\times10^{17}$ to $1\times10^{19}$ cm$^3$, which is higher than the impurity concentration in the drift layer 20. Then, the implantation mask is removed. As a result of this step, the region ion-implanted with Al becomes the first well region 30 and the second well region 31.

Next, an implantation mask is formed using a photoresist, for example, on the surface of the drift layer 20, and Al as p-type impurities is ion-implanted. At this time, the depth of the ion implantation with Al is set in a range from about 0.5 to about 3 μm not exceeding the thickness of the drift layer 20. The impurity concentration of the ion-implanted Al is in a range from $1\times10^{16}$ to $1\times10^{18}$ cm$^3$, which is higher than the impurity concentration in the drift layer 20 and lower than the impurity concentration in the first well region 30. Then, the implantation mask is removed. As a result of this step, the region ion-implanted with Al becomes the JTE region 37. Likewise, Al is ion-implanted into a predetermined region to a higher impurity concentration than the impurity concentration in the first well region 30, thereby forming the contact region 32.

Next, an implantation mask is formed using a photoresist, for example, so as to form an opening at a predetermined position inside the first well region 30 in the surface of the drift layer 20. Then, nitrogen (N) as n-type impurities is ion implanted. The depth of the ion implantation with N is set to be smaller than the thickness of the first well region 30. The impurity concentration of the ion-implanted N is in a range from $1\times10^{18}$ to $1\times10^{21}$ cm$^3$, which exceeds the p-type impurity concentration in the first well region 30. A region in the region implanted with N in this step and exhibiting the n type becomes the source region 40.

Next, a thermal processing device performs annealing in an atmosphere of inert gas such as argon (Ar) gas, at a temperature from 1300 to 1900° C., and in a duration from 30 seconds to one hour. As a result of this annealing, the ion implanted N and Al are electrically activated.

Then, by the use of CVD process or photolithography technique, for example, the conductive layer 47 made of n-type polycrystalline silicon is formed on the second well region 31. Further, by the use of CVD process or photolithography technique, for example, the field insulating film 51 made of silicon oxide having a thickness from 0.5 to 2 μm is formed on the semiconductor layer in a region other an active region substantially corresponding to a region where the first well region 30 is formed.

Next, a surface of the silicon carbide uncovered by the field insulating film 51 is thermally oxidized to form a silicon oxide film as the gate insulating film 50 having an intended thickness. A polycrystalline silicon film having conductivity is thereafter formed by low pressure CVD process on the gate insulating film 50 and the field insulating film 51 and then patterned, thereby forming the gate electrode 60. Next, the interlayer insulating film 55 made of silicon oxide is formed by low pressure CVD process. Then, the first well region contact hole 90 is formed to penetrate the interlayer insulating film 55 and the gate insulating film 50 and reach the contact region 32 and the source region 40 in the active region. At the same time, the conductive layer contact hole 91 is formed to reach the conductive layer 47.

Next, a metal film mainly containing Ni is formed by sputtering process, for example. Then, the metal film is subjected to thermal process at a temperature from 600 to 1100° C. to make the metal film mainly containing Ni react with the silicon carbide layer in the first well region contact hole 90, thereby forming silicide between the silicon carbide layer and the metal film. Next, the residual metal film other than the silicide resulting from the reaction is removed by wet etching. By doing so, the unremoved silicide becomes the ohmic electrode 70. In this way, the ohmic electrode 70 is formed.

Then, a metal film mainly containing Ni is formed on the back surface (second main surface) of the semiconductor substrate 10 and thermally processed, thereby forming a back surface ohmic electrode (not shown in the drawings) on the back side of the semiconductor substrate 10.

A next step is patterning using a photoresist, for example, to remove the interlayer insulating film 55 and the gate insulating film 50 on the first separation region 21 and the interlayer insulating film 55 at position where the gate contact hole 95 is to be formed. The interlayer insulating film 55 may be removed by a wet etching method not to cause damage on the surface of the silicon carbide layer to become a Schottky interface.

Then, a metal film to become a Schottky electrode is deposited by sputtering process, for example. Patterning is performed using a photoresist, for example, thereby forming the first Schottky electrode 71 on the first separation region 21 in the first well region contact hole 90.

Next, wiring metal such as Al is formed by sputtering process or deposition process on the surface of the substrate having been processed, and processed into a predetermined shape by photolithography technique, thereby forming the source electrode 80 contacting the ohmic electrode 70, the first Schottky electrode 71, and the conductive layer 47 belonging to the source side, and the gate pad 81 and the gate line 82 contacting the gate electrode 60.

Further, the drain electrode 84 as a metal film is formed on a surface of the back surface ohmic electrode (not shown in the drawings) formed on the back surface of the substrate. As a result, formation of the silicon carbide semiconductor device of this embodiment shown in FIGS. 1 to 3 is completed.

Next, the operation of the SiC-MOSFET with built-in SBD as the silicon carbide semiconductor device of this embodiment will be described. In the silicon carbide semiconductor device described in this example, a semiconductor material is 4H-type silicon carbide. In this case, a diffusion potential at a pn junction is substantially 2 V.

Free-wheeling operation will be considered first.

In the free-wheeling operation, a drain voltage (a voltage at the drain electrode 84) is lower than a source voltage (a voltage at the source electrode 80) to generate a voltage of several volts between the source and the drain. In the presence of the source electrode 80 in ohmic connection with the second well region 31 through the ohmic electrode 70, much of the source-to-drain voltage is applied to the pn junction between the second well region 31 and the drift layer 20, thereby causing a bipolar current to flow in a pn diode formed from the second well region 31 and the drift layer 20.

Meanwhile, in the silicon carbide semiconductor device of the present invention, the second well region 31 is not in ohmic connection with the source electrode 80. Further, during the free-wheeling operation, a reverse bias is applied to a Schottky diode between the conductive layer 47 (in ohmic connection with the source electrode 80) and the second well region 31. Thus, majority carriers are not injected into the second well region 31 during the free-wheeling operation. This prevents flow of a bipolar current as a forward current into the pn junction between the second well region 31 and the drift layer 20, making it possible to suppress extension of stacking fault at the pn junction and reduction in an insulation breakdown voltage to be caused the extension of the stacking fault.

To achieve the foregoing effect during the free-wheeling operation, it is required to prevent formation of an effective conduction path of majority carriers to the second well region 31 as a result of voltage application during the free-wheeling operation. More specifically, it is required to prevent reverse breakdown of the Schottky connection between the conductive layer 47 and the second well region 31 to be caused by voltage application during the free-wheeling operation, and to prevent punch-through at a pnp structure formed from the second well region 31, the third separation region 23, and the first well region 30 to be caused by voltage application during the free-wheeling operation.

The punch-through phenomenon will be described below.

The second well region 31 has the n-type third separation region 23 formed between the second well region 31 and the first well region 30 adjacent to the second well region 31. The pnp structure formed from the first well region 30, the third separation region 23, and the second well region 31 is formed in a conduction path to the source electrode 80 in the second well region 31 through the first well region 30 in ohmic connection with the source electrode 80. The second well region 31 is not in direct ohmic connection with the source electrode 80.

This pnp structure has a pn junction of a reverse bias applied in any voltage direction, so that a current generally does not flow in this pnp structure. If the width of the third separation region 23 is small, however, application of a voltage being a punch-through voltage or more causes current passage.

It is assumed that both the p-type impurity concentration in the first well region 30 and the p-type impurity concentration in the second well region 31 are higher than an n-type impurity concentration in the third separation region 23.

The following one-dimensional Poisson equation is given:

$$d^2\Phi/dx^2 = -qN/\varepsilon.\quad\quad\text{[Formula 1]}$$

Based on this equation, the foregoing punch-through voltage is derived as follows as a solution of x=W:

$$v = qN_{effect}W^2/(2\varepsilon).\quad\quad\text{[Formula 2]}$$

Here, q is elementary electric charge, $N_{effect}$ is effective impurity concentration in the third separation region 23, W is the width of the third separation region 23, and $\varepsilon$ is the permittivity of silicon carbide semiconductor.

Thus, voltage variation occurring in the second well region 31 during the free-wheeling operation can be handled by preventing application of the punch-through voltage calculated from the formula 2 from being applied to the pnp structure formed from the first well region 30, the third separation region 23, and the second well region 31.

Turn-off operation will be described next.

During the turn-off operation, a potential at the drain electrode 84 increases steeply to apply a reverse bias to the pn junction formed between the second well region 31 and the drift layer 20. As a result, a depletion layer extends from the pn junction surface to the opposite sides of the second well region 31 and the drift layer 20. At this time, the extension of the depletion layer increases the density of holes in a non-depleted region in the second well region 31 and these holes are passed toward the source electrode 80 through the conductive layer 47. Meanwhile, holes in the second well region 31 generated at a part separated in a plane direction from a part (conductive layer contact hole 91) contacting the source electrode 80 move in a chip plane direction in the second well region 31 or the conductive layer 47 to reach the source electrode 80. This current is called a displacement current. This displacement current increases with increase in a switching speed (dV/dt). At this time, the current from the second well region 31 toward the conductive layer 47 flows in the forward direction of the Schottky diode. This prevents generation of a voltage at such a high level as to cause insulation breakdown of the gate insulating film between the second well region 31 and the conductive layer 47.

In this embodiment, the provision of the conductive layer 47 lower in sheet resistance than the second well region 31 makes it possible to reduce a voltage resulting from the displacement current flowing from the second well region 31 to the source electrode 80 to a level considerably lower than a level in the absence of the conductive layer 47.

Finally, turn-on operation will be described.

During the turn-on operation, a drain voltage at the drain electrode 84, which is at a high level in an OFF period, decreases steeply to approach the ON voltage of the MOSFET. At this time, the depletion layer formed at the pn junction between the second well region 31 and the drift layer 20 shrinks steeply. In response to this, a displacement current in the opposite direction to the displacement current during the turn-off operation flows from the source electrode 80 toward the second well region 31. The displacement current in the turn-on period also increases with increase in the switching speed (dV/dt).

A displacement current in the plane direction flows, mainly in the conductive layer 47 at a low sheet resistance toward the part separated in a plane direction from the part (conductive layer contact hole 91) contacting the source electrode 80. By doing so, a voltage resulting from the displacement current can be prevented from being increased to such a high level as to cause insulation breakdown of an insulating layer formed above the conductive layer 47. A reverse bias is applied between the second well region 31 and the conductive layer 47 to form a depletion layer between the second well region 31 and the conductive layer 47. Meanwhile, as an AC current flows therebetween, the displacement current mainly flows in the conductive layer 47 at a low sheet resistance.

The drift layer 20 has a lower carrier concentration and the conductive layer 47 has a low resistance, so that a depletion layer capacity per unit area corresponding to a voltage of 1 V formed between the second well region 31 and the conductive layer 47 is larger than a pn junction capacity per unit area corresponding to a voltage of 1 V formed between the second well region 31 and the drift layer 20. By the presence of a large pn junction capacity between the second well region 31 and the conductive layer 47, an AC current is caused to flow easily. By doing so, it becomes possible to cause an AC displacement current to flow from the second well region 31 to the conductive layer 47 without generating a high voltage at the second well region 31.

A reverse bias is applied to the Schottky diode formed between the second well region 31 and the conductive layer 47, so that a DC current does not flow between the second well region 31 and the conductive layer 47.

As described above, a DC current path does not exist in the second well region 31 during the turn-on operation, making it impossible to inject holes into the second well region 31 during the turn-on operation. Hence, after the turn-on operation, holes in the second well region 31 are reduced by a DC current having flowed into the second well region 31 and the source electrode 80 through the conductive layer 47 during the turn-off operation to charge the second well region 31 negatively. As a result of this charging, a negative voltage is generated in the second well region 31.

The amount of the negative charge generated in the second well region 31 has an approximate value that can be estimated as a depletion layer charge amount determined between the drift layer 20 and the second well region 31 during application of an electric field E in an OFF state according to the Gauss's law (divE= $\varrho$ /$\varepsilon$, where E is electric field and $\varrho$ is charge density).

If the electric field E is 2 MV/cm close to the insulation breakdown voltage of silicon carbide, for example, a total amount of depletion layer charge generated in the second well region 31 is calculated as about 1.8 μC/cm² per unit area viewed in a plane direction. Even in the presence of negative depletion layer charge of such an amount, insulation breakdown is still required to be avoided in the insulating film formed on the second well region 31 such as the gate insulating film 50.

Assuming that a voltage generated in the second well region 31 after the turn-on operation is $V_{onpw}$, $V_{onpw}$ is expressed by the following formula:

$$V_{onpw} = Q_{drift} \int \frac{dV}{C_{surround}(V)} \qquad \text{[Formula 3]}$$

Here, $C_{surround}(V)$ is a capacity formed between the second well region 31 and an external region and is the function of a voltage V at the second well region 31. If V takes a negative value, a main component of $C_{surround}(V)$ is a depletion layer capacity formed between the second well region 31 and the conductive layer 47. Further, $Q_{drift}$ is a total amount of depletion layer charge generated in the drift layer 20 in an OFF state. With increase in $C_{surround}(V)$, it becomes possible to charge a large depletion layer capacity formed between the second well region 31 and the conductive layer 47 with negative charge generated in the second well region 31 directly after the turn-on operation, thereby reducing the absolute value of $V_{onpw}$.

A specific constituting element of $C_{surround}(V)$ includes a depletion layer capacity at the Schottky connection between the conductive layer 47 and the second well region 31, a depletion layer capacity at the pn junction between the conductive layer 47 and the drift layer 20, a capacity between the gate electrode 60 or the gate pad 81 and the second well region 31, etc. The capacity between the second well region 31 and the gate electrode 60 or the gate pad 81 is small. However, by the presence of a depletion layer capacity between the drift layer 20 and the second well region 31 and a depletion layer capacity between the conductive layer 47 and the second well region 31 larger than the former depletion layer capacity, $C_{surround}(V)$ can be increased sufficiently. Thus, in response to negative charge generated during turn-on, the absolute value of the voltage $V_{onpw}$ generated in the second well region 31 can be reduced to a level that does not cause breakdown of the gate insulating film.

Even if the capacity $C_{surround}(V)$ formed between the second well region 31 and an external region is not sufficiently large, setting a punch-through voltage at the pnp structure including the second well region 31, the third separation region 23, and the first well region 30 to a proper value makes it possible to suppress increase in a voltage generated in the second well region 31.

If the punch-through voltage of the pnp structure including the second well region 31, the third separation region 23, and the first well region 30 is designed to be larger than a value determined by subtracting a diffusion potential at the pn junction from a source-to-drain voltage generated during the free-wheeling operation, to be smaller than the breakdown voltage of the insulating film formed on the second well region 31, desirably, to be a half or less of the breakdown voltage, the insulation breakdown of the insulating film formed on the second well region 31 can be prevented.

As described above, in the silicon carbide semiconductor device of this embodiment, the conductive layer 47 in Schottky connection with the second well region 31 and lower in sheet resistance than the second well region 31 is formed on the second well region 31, and the conductive layer 47 and the source electrode 80 are in ohmic connection with each other through the conductive layer contact hole 91. Thus, bipolar operation in the terminal region can be suppressed during the free-wheeling operation of the MOSFET, a voltage generated on the second well region 31 during the turn-on operation can be reduced, and the occurrence of the insulation breakdown of the insulating film on the second well region 31 can be reduced.

Further, charging a large depletion layer capacity formed between the second well region 31 and the conductive layer 47 with negative charge generated in the second well region 31 directly after the turn-on operation makes it possible to reduce voltage change in the second well region 31, so that the occurrence of the insulation breakdown of the insulating film formed on the second well region 31 can be prevented.

Additionally, the insulation breakdown of the insulating film on the second well region 31 can also be prevented by performing auxiliary means of setting the punch-through voltage of the pnp structure formed between the second well region 31 and the first well region 30 properly.

In this embodiment, the conductive layer 47 formed on the second well region 31 is described as being made of polycrystalline silicon. However, this is not the only material for the conductive layer 47 but the conductive layer 47 may be made of a different semiconductor material or metal such as Ti to form Schottky connection with the second well region 31.

The gate electrode 60 on the second well region 31 is described as being formed across the gate insulating film 50 between the gate electrode 60 and the second well region 31. However, the insulating film between the gate electrode 60 and the second well region 31 is not required to be the gate insulating film 50 but it can be the field insulating film 51 or an insulating film having a different thickness.

While the second well region 31 has been described as not in ohmic connection with the source electrode 80, the second well region 31 may partially be in ohmic connection with the source electrode 80.

Figure 4:
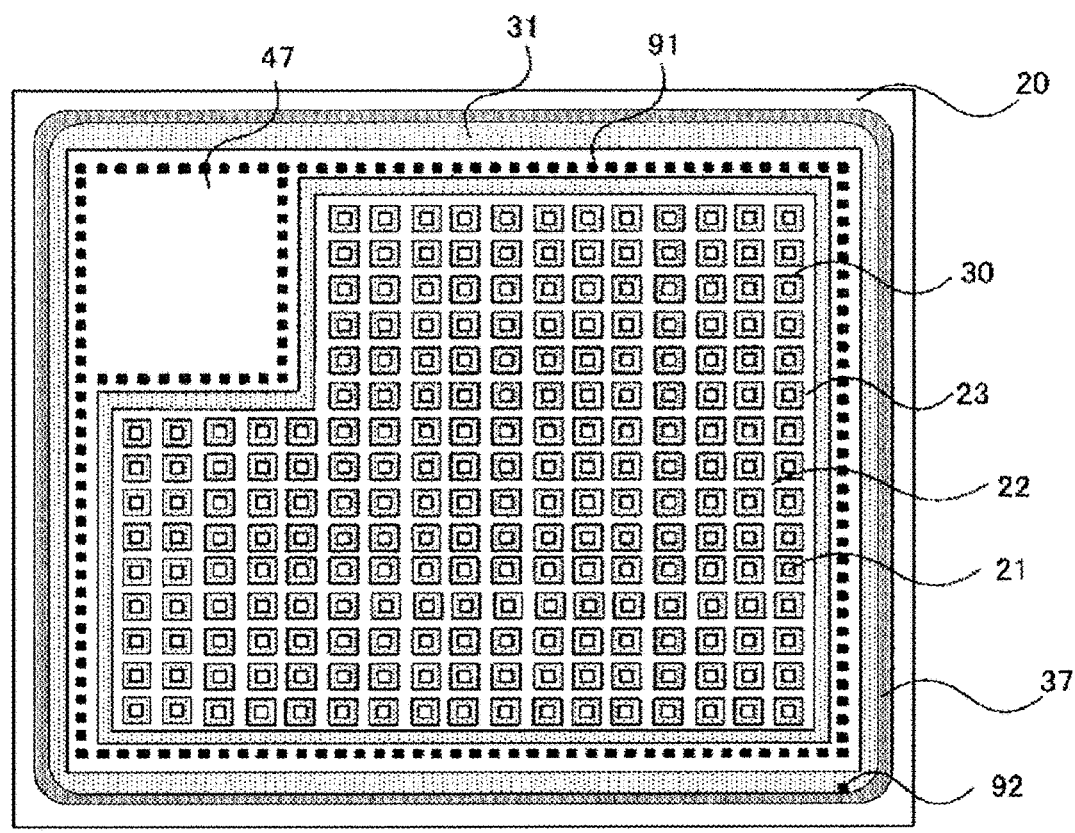
FIG. 4 is a schematic plan view of the silicon carbide semiconductor device according to the first embodiment of the invention having a different structure.
Figure 5:
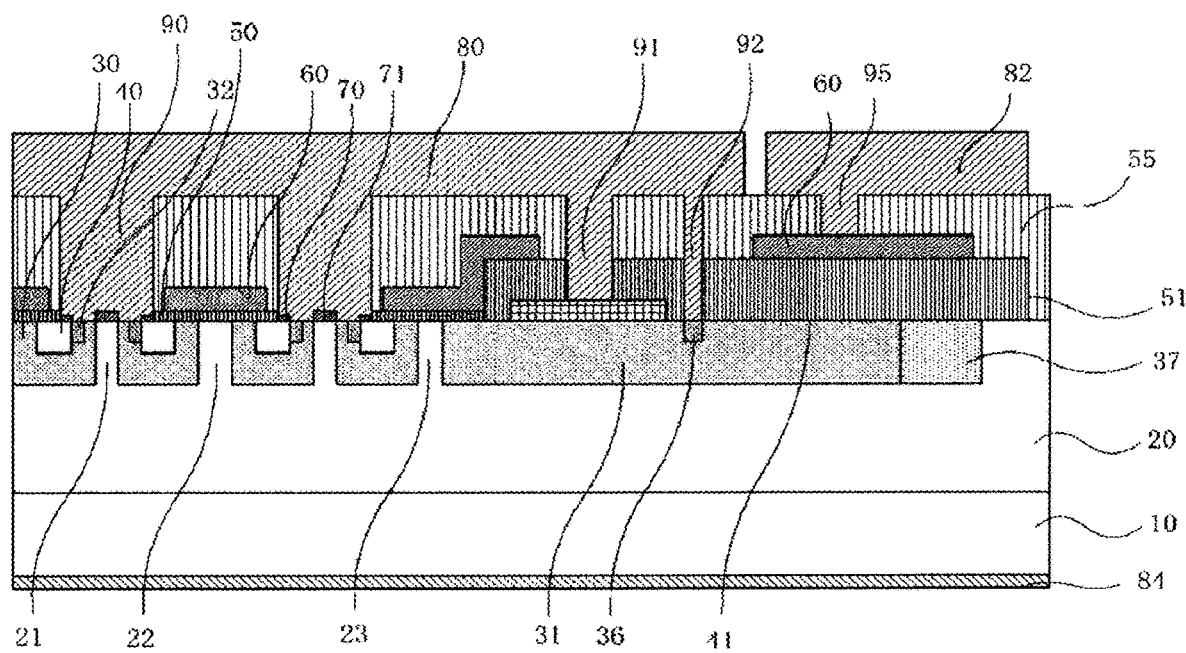
FIG. 5 is a schematic sectional view of the silicon carbide semiconductor device according to the first embodiment of the invention having a different structure.

FIG. 4 is a schematic plan view mainly showing a part corresponding to silicon carbide semiconductor according to a different aspect of the silicon carbide semiconductor device of this embodiment. In FIG. 4, the second well region 31 has a part where a second well region contact hole 92 is formed for ohmic connection between the second well region 31 and the source electrode 80. FIG. 5 is a schematic sectional view showing a cross section including the part where the second well region contact hole 92 of FIG. 4 is formed. In FIG. 5, the second well region contact hole 92 is formed to penetrate the field insulating film 51 and the interlayer insulating film 55. The second well region 31 under the second well region contact hole 92 may include a low-resistance second well contact region 36 lower in p-type impurity concentration than the second well region 31.

The second well region contact hole 92 is separated from the conductive layer contact hole 91 by 10 μm or more on a shortest path in the second well region 31 in a lateral direction in a cross section. A distance between the conductive layer contact hole 91 and the second well region contact hole 92 on the shortest path in the second well region 31 is more preferably 50 μm or more.

In this embodiment, the first well region 30 and the second well region 31 are described as being separated from each other. Alternatively, the first well region 30 and the second well region 31 may be continuous with each other. Additionally, while the first well region 30 is described as including multiple first well regions 30 and the multiple first well regions 30 are described as being separated from each other, the multiple first well regions 30 may be continuous with each other. FIG. 6 is a schematic plan view of the silicon carbide semiconductor device of this embodiment where the first well region 30 and the second well region 31 are continuous with each other and the multiple first well regions 30 are continuous with each other. In this case, the first well region contact hole 90 formed in the first well region 30 is separated from the conductive layer contact hole 91 by 10 μm or more on a shortest path in the first well region 30 or the second well region 31 in a lateral direction in a cross section. A distance between the conductive layer contact hole 91 and the first well region contact hole 90 on the shortest path in the first well region 30 or the second well region 31 is more preferably 50 μm or more.

Figure 7:
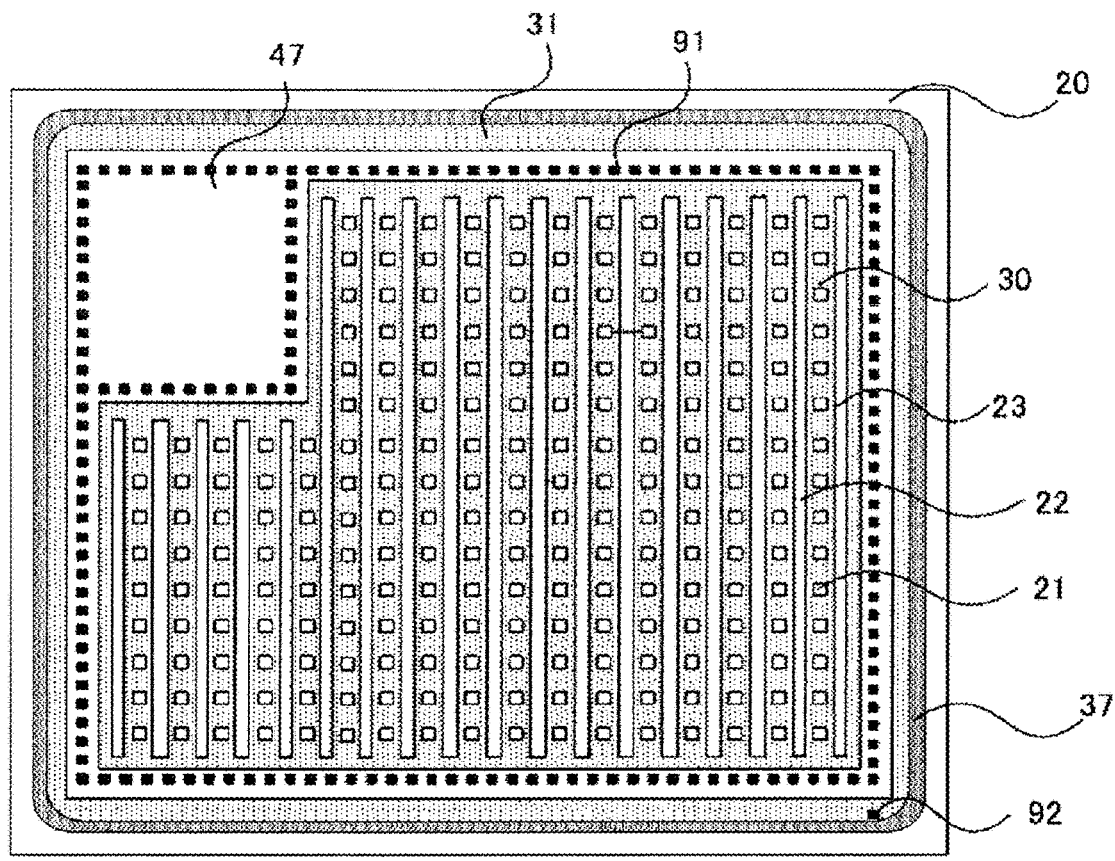
FIG. 7 is a schematic plan view of the silicon carbide semiconductor device according to the first embodiment of the invention having a different structure.

Like in FIG. 4, the second well region contact hole 92 may also be formed in the second well region 31 in the structure where the first well region 30 and the second well region 31 are continuous with each other. FIG. 7 is a schematic plan view showing a structure where the second well region contact hole 92 is formed in the second well region 31 in the silicon carbide semiconductor device shown in FIG. 6. In this case, a distance between the conductive layer contact hole 91 and the second well region contact hole 92 on the shortest path in the second well region 31 is also preferably 10 μm or more, more preferably, 50 μm or more.

In principle, if the first well region 30 and the second well region 31 are continuous with each other on a plane as shown in FIG. 6, the second well region 31 is required to be electrically isolated from the source electrode 80 at the time of voltage application during the free-wheeling operation. It is assumed, for example, that a bipolar current of a current density J (A/cm²) flows in a well region of the second conductivity type in a region having an area S (cm²) and formed at a position separated from the connection with the source electrode 80 during the free-wheeling operation. In this case, assuming that a resistance value in a path between the region of the area S and the source electrode 80 is $R_{tot}$ (Ω) and a potential at the source electrode 80 is 0 V, a potential $V_{drop}$ (V) at this region is expressed as $V_{drop} = J \times S \times R_{tot}$.

It is assumed, for example, that there is a region existing at a separated position from a connection between the first well region 30 and the second well region 31 and closer to the second well region 31 by 10 μm from this connection, and this region extends a depth of 50 μm from the separated position to be away from the connection. It is further assumed that a bipolar current having a current density not causing growth of stacking fault such as a current density J of 5 A/cm², for example, flows in the region extending the depth of 50 μm from the separated position. Further, the second well region 31 is assumed to have a sheet resistance $R_{sheet}$ of 100 kΩ/sq. In this case, a resistance value per width of 1 μm in a current path from the separated position to the connection ($R_{tot}$ per width of 1 μm) is determined to be 1 MΩ. As a result of flow of a bipolar current total of $2.5 \times 10^{-6}$ A (J×S) corresponding to the region extending the depth of 50 μm from the separated position, $V_{drop}$ between the separated position and the connection becomes 2.5 V. In this case, assuming that the connection is at 0 V, a bipolar current does not flow unless a drain voltage at the separated position during the free-wheeling operation changes from about 4.5 V determined by adding the absolute value of $V_{amp}$ and that of about 2 V corresponding to a diffusion potential at a pn junction in SiC to about −4.5 V (a negative value corresponding to the foregoing value calculated using the absolute values). If the separated position is separated by 50 μm from the connection to be closer to the second well region 31, $V_{drop}$ becomes 12.5 V. Thus, a bipolar current does not flow unless a drain voltage during the free-wheeling operation becomes about −14.5 V.

As described above, if the second well region 31 extending in the width direction also exists at the position separated from the connection between the first well region 30 and the second well region 31, $V_{drop}$ is generated. In this case, a bipolar current does not flow unless a drain voltage takes a negatively large value during the free-wheeling operation.

Thus, the second well region 31 satisfying the foregoing condition can be considered to be electrically isolated from the first well region 30 sufficiently. As a result, the effect of the present invention is achieved in the second well region 31 separated from the connection with the first well region 30.

More strictly, a voltage at an ohmic contact position in an active cell, specifically, a voltage in a current path from the ohmic electrode 70 in the first well region 30 to the connection is required to be added to $R_{tot}$. If the ohmic electrode 70 exists in a region separated by 10 μm from the connection, the effect of the present invention is achieved in a region external to the connection. The effect of the present invention is achieved more notably in a region separated further externally from the connection by 40 μm. In this case, a distance between the first well region contact hole 90 and the conductive layer contact hole 91 may be 10 μm or more, more desirably, 50 μm or more.

As shown in FIG. 6, even in the presence of ohmic contact (second well region contact hole 92) with the source electrode 80 on the second well region 31, as long as a distance of 10 μm or more is ensured between the second well region contact hole 92 and the conductive layer contact hole 91, the effect of the present invention is still achieved for the same reason as that given in the foregoing description. In this case, a distance between the second well region contact hole 92 and the conductive layer contact hole 91 is also more preferably 50 μm or more.

In the second well region 31 in ohmic connection with the source electrode 80, with $V_{drop}$ at about 2 V or more and with a drain voltage set at about negative 4 V, for example, a voltage determined by subtracting $V_{drop}$ from the drain voltage becomes about 2 V or less corresponding to a diffusion potential at a pn junction in SiC. Thus, a current of such a level as to cause extension of stacking fault does not flow in this second well region 31. Thus, in such a case, even if this second well region 31 is located in what is called a terminal region directly below the gate pad 81 or the gate line 82 or near such a position, and this second well region 31 is at the foregoing distance of not exceeding 10 μm from either the first well region contact hole 90 or the second well region contact hole 92, a bipolar current of such a level as to cause extension of stacking fault does not flow in this well region.

Likewise, if the first well region 30 and the second well region 31 are continuous with each other as shown in FIG. 6, limitation is imposed by a resistance value in a path from a predetermined well region to the source electrode 80 in addition to the foregoing limitation. It is assumed that a free-wheeling current flows at a current density of 5 A/cm² as a current density not causing extension of stacking fault, for example, and there is a region of 10 μm×10 μm where a resistance value in a path from this region to the source electrode 80 is 400 kΩ. In this case, the foregoing $V_{drop}$ (V) is calculated as 2 V. With a drain voltage of 4 V, a value determined by subtracting $V_{drop}$ from the drain voltage becomes smaller than a diffusion potential at a pn junction in this region to allow suppression of bipolar operation during the free-wheeling operation.

In the example described in this embodiment, the ion implantations are performed in predetermined order. However, the order of the ion implantations may be changed, where appropriate. Further, the order of forming the ohmic electrode on the back surface, the ohmic electrode 70 on the front surface, and the first Schottky electrode 71 may be changed, where appropriate.

While the ohmic electrode 70 and the first Schottky electrode 71 are described as being different members from the source electrode 80, these members can partially be formed simultaneously using the same material within a range in which the functions of these members are fulfilled.

In the foregoing description, the first conductivity type and the second conductivity type are the n type and the p type respectively and may have the reversed types. However, the first conductivity type being the n type and the second conductivity type being the p type achieve more effective result.

The ratio of the conductive layer 47 in a plan view formed on the second well region 31 has not particularly been mentioned. Meanwhile, as improving the conductivity of the second well region 31 is also intended by the conductive layer 47, the conductive layer 47 is desirably formed to a larger ratio in the plane direction of the second well region 31. For example, the conductive layer 47 may be formed to extend a half or more of the area of the second well region 31, more desirably, 80% or more of the area of the second well region 31.

The conductive layer 47 formed on the second well region 31 is not always required to be formed continuously but it may have a shape with a gap.

The conductive layer 47 is intended to reduce a resistance in a plane lateral direction on the second well region 31, so that it desirably has a width corresponding to a half or more of the width of the second well region 31 in a cross section, more desirably, a width corresponding to 80% or more of the width of the second well region 31. As long as the conductive layer 47 satisfies a minimum condition of being larger in area than the conductive layer contact hole 91, the effect of the present invention is achieved.

Figure 8:
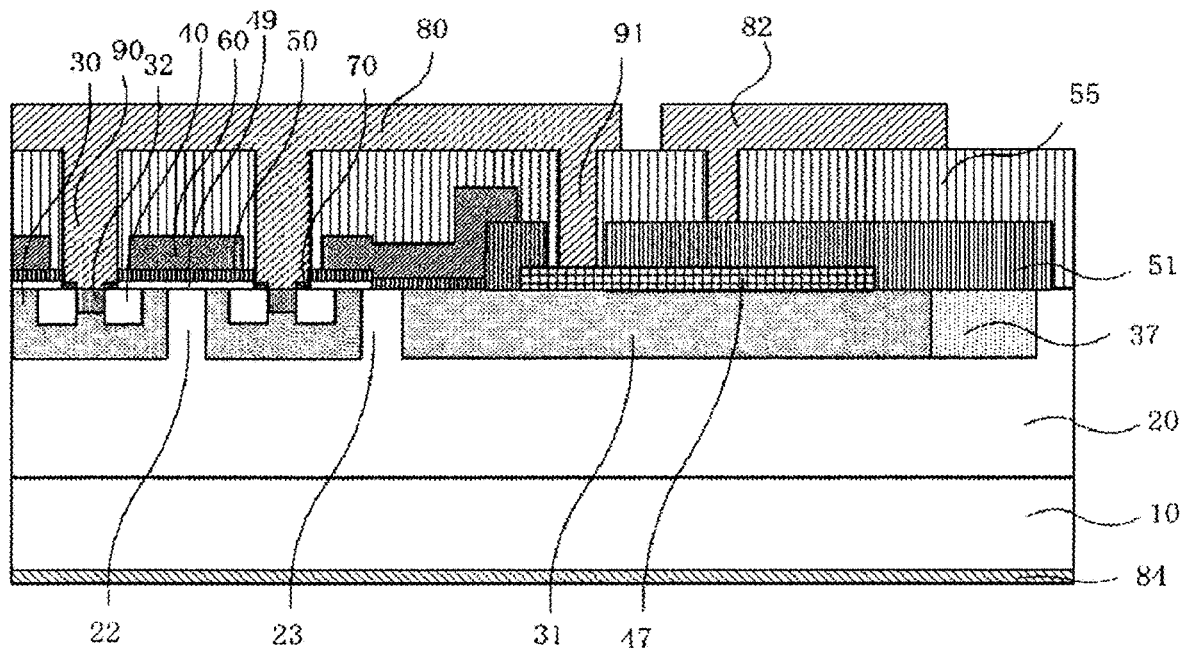
FIG. 8 is a schematic sectional view of the silicon carbide semiconductor device according to the first embodiment of the invention having a different structure.

In the example described in this embodiment, the MOSFET with built-in SBD is provided in the active region. Meanwhile, the MOSFET with built-in SBD may be replaced by an MOSFET in which an n-type channel epitaxial layer 49 is formed on a p-type well region, the channel epitaxial layer 49 operates as a unipolar diode at a gate voltage being a threshold voltage or less, and the start-up voltage of the unipolar diode is designed to be lower than the operating voltage of a pn diode formed from the p-type well region and an n-type drift layer. FIG. 8 shows a schematic sectional view of an MOSFET corresponding to such an MOSFET as a replacement for the MOSFET with built-in SBD shown in FIG. 2. Even in such a case of reverse passage of a current in a channel region in the MOSFET during the free-wheeling operation, effect comparable to that achieved by the MOSFET with built-in SBD is still achieved.

Second Embodiment

In the example of the silicon carbide semiconductor device described in the first embodiment, the conductive layer 47 is provided on the second well region 31 so as to directly contact the second well region 31. In a silicon carbide semiconductor device of a second embodiment, the conductive layer 47 is provided over the second well region 31 across an insulating layer 53. The other structure will not be described in detail as it is the same as that in the first embodiment.

Figure 9:
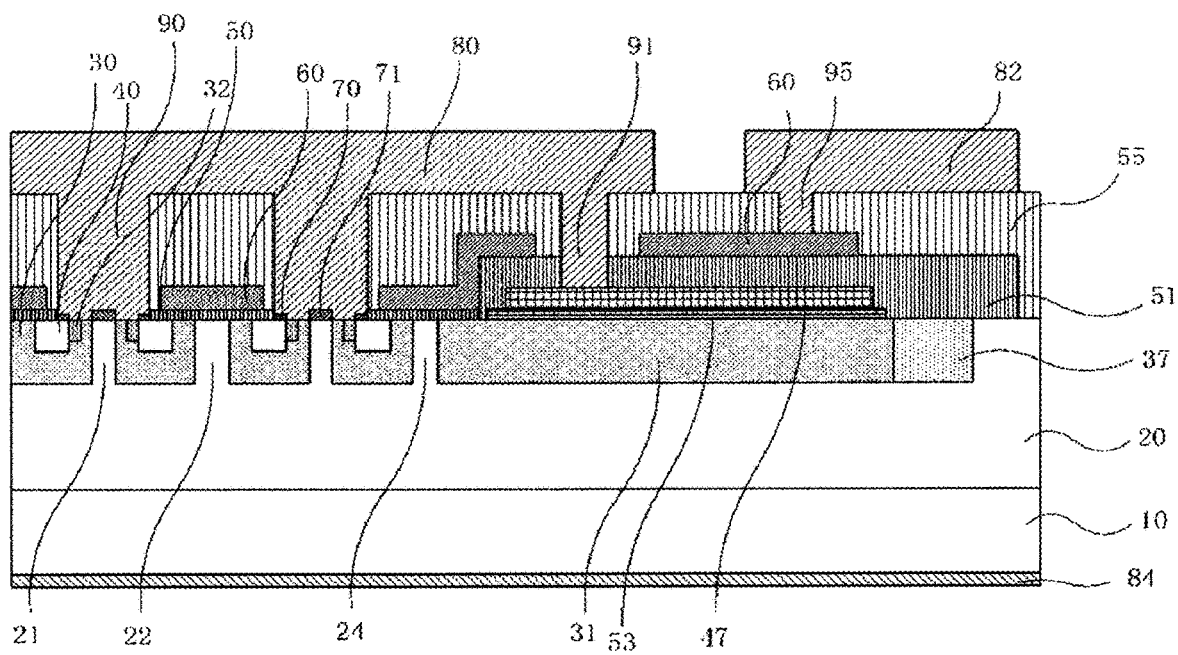
FIG. 9 is a schematic sectional view of a silicon carbide semiconductor device according to a second embodiment of the invention.

FIG. 9 is a schematic sectional view of the silicon carbide semiconductor device of this embodiment schematically showing a cross section in the part a-a' from the source electrode 80 to the gate line 82 at an outer peripheral part of the silicon carbide semiconductor device in FIG. 1 referred to in the description of the first embodiment.

In a terminal region of FIG. 9, the insulating layer 53 is formed between the second well region 31 and the conductive layer 47.

The insulating layer 53 can be made of an insulating material such as a silicon oxide material. The insulating material may be silicon nitride or aluminum oxide, for example. The insulating layer 53 may be formed in the same step using the same material as the gate insulating film 50. Like the gate insulating film 50, the insulating layer 53 may be formed by thermally oxidizing a silicon carbide layer. To increase capacity coupling between an upper part and a lower part of the insulating layer 53, the thickness of the insulating layer 53 is preferably not too large. For example, this thickness may be 200 nm or less if a silicon oxide material is used.

The conductive layer 47 on the insulating layer 53 may be formed in the same step using the same material as the gate electrode 60.

By forming the insulating layer 53 in the same step using the same material as the gate insulating film 50 and forming the conductive layer 47 in the same step using the same material as the gate electrode 60, manufacturing process is simplified.

For forming the insulating layer 53 in the same step using the same material as the gate insulating film 50 and forming the conductive layer 47 in the same step using the same material as the gate electrode 60, the method of manufacturing the silicon carbide semiconductor device of the first embodiment may be changed as follows.

In the first embodiment, the conductive layer 47 is formed on the second well region 31 before formation of the field insulating film 51. Instead of performing this step, the insulating layer 53 and the conductive layer 47 may be formed simultaneously on the second well region 31 in a step of forming the gate insulating film 50 and the gate electrode 60 in the active region after formation of the field insulating film 51.

The operation of the silicon carbide semiconductor device of this embodiment will be described next.

In the silicon carbide semiconductor device of this embodiment, the second well region 31 and the conductive layer 47 form a capacitor across the insulating layer 53. This capacitor functions as a current path in which a displacement current flowing in a plane direction in the second well region 31 is caused to flow as an AC current in response to application of dV/dt during turn-on/turn-off. When the Schottky junction between the second well region 31 and the conductive layer 47 of the first embodiment is reversely biased, this capacitor functions in the same way as a depletion layer capacity therebetween. Like in the first embodiment, this makes it possible to suppress a voltage generated from the displacement current during voltage switching. In this way, the capacitor between the second well region 31 and the conductive layer 47 is charged with positive charge generated in the second well region 31 directly after turn-off to control a voltage generated in the second well region 31 at a low level, making it possible to prevent insulation breakdown of the insulating film formed on the second well region 31.

Like in the first embodiment, the absence of ohmic connection of the second well region 31 with the source electrode 80 suppresses a bipolar current to flow in the second well region 31. Further, like in the first embodiment, the second well region 31 can be in ohmic connection with the source electrode 80 under a certain condition.

Figure 10:
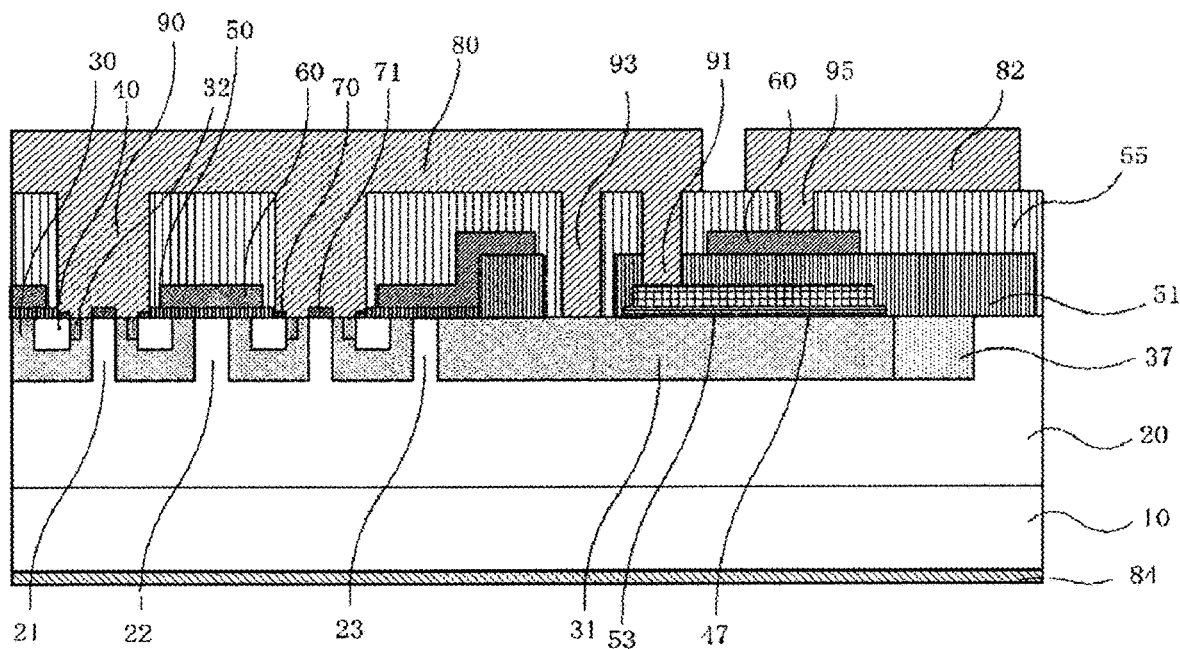
FIG. 10 is a schematic sectional view of the silicon carbide semiconductor device according to the second embodiment of the invention.

As shown in the schematic sectional view of FIG. 10, a Schottky contact hole 93 connecting the second well region 31 and the source electrode 80 may be provided to form Schottky connection between the second well region 31 and the source electrode 80. By doing so, it becomes possible to reduce charging of the second well region 31 more effectively immediately after turn-off operation.

Third Embodiment

In the example described in the first embodiment, the conductive layer 47 is provided on the second well region 31. In a silicon carbide semiconductor device of a third embodiment, the second well region 31 made of a silicon carbide material and having the second conductivity type has a low-resistance upper layer area of the first conductivity type to form a pn junction between this layer and the second well region 31. Here, this n-type layer functions in the same way as the conductive layer 47. The other structure will not be described in detail as it is the same as that in the first embodiment.

Figure 11:
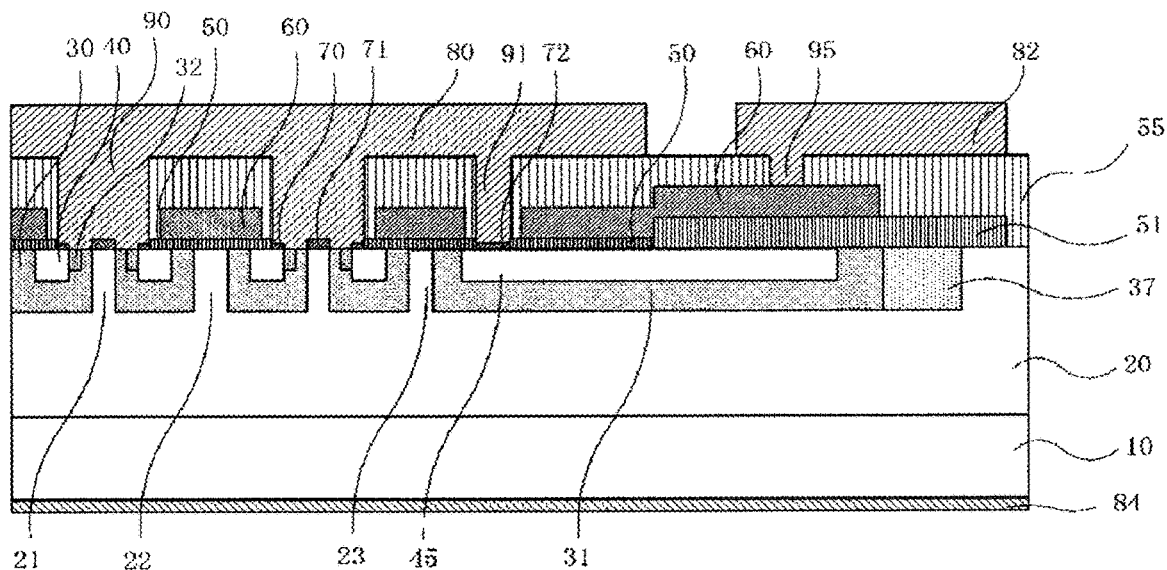
FIG. 11 is a schematic sectional view of a silicon carbide semiconductor device according to a third embodiment of the invention.

FIG. 11 is a schematic sectional view of the silicon carbide semiconductor device of this embodiment schematically showing a cross section in the part a-a' from the source electrode 80 to the gate line 82 at an outer peripheral part of the silicon carbide semiconductor device in FIG. 1 referred to in the description of the first embodiment.

In a terminal region of FIG. 11, the second well region 31 of the second conductivity type has an upper layer area provided with a silicon carbide conductive layer 45 lower in resistance and higher in impurity concentration than the drift layer, made of a silicon carbide material, and having the first conductivity type. The second well region 31 and the source electrode 80 are not in ohmic connection with each other.

The silicon carbide conductive layer 45 may have a thickness in a range from 50 to 1000 nm, for example, which is smaller than the thickness of the second well region 31. The impurity concentration in the silicon carbide conductive layer 45 may be in a range from $1\times10^{17}$ to $1\times10^{19}$ cm$^{-3}$, for example.

The silicon carbide conductive layer 45 and the source region 40 may be formed in the same step, to the same thickness, and to the same impurity concentration. The silicon carbide conductive layer 45 and the source region 40 can certainly be formed in different steps, to different thicknesses, and to different impurity concentrations.

The following describes a method of manufacturing the silicon carbide semiconductor device of this embodiment by which the silicon carbide conductive layer 45 and the source region 40 are formed in the same step, to the same thickness, and to the same impurity concentration.

In the first embodiment, the conductive layer 47 is formed on the second well region 31 before formation of the field insulating film 51. Instead of performing this step, in the ion implantation step for forming the source region 40, the silicon carbide conductive layer 45 may be formed together in the upper layer area of the second well region 31.

This manufacturing method allows simplification of the process of manufacturing the silicon carbide semiconductor device to allow reduction in manufacturing cost.

The operation of the silicon carbide semiconductor device of this embodiment will be described next.

In the silicon carbide semiconductor device of the first embodiment, the Schottky junction is formed between the second well region 31 and the conductive layer 47. In the silicon carbide semiconductor device of this embodiment, a pn junction is formed at a corresponding position between the second well region 31 and the silicon carbide conductive layer 45. This pn junction functions in the same way as the Schottky junction in the silicon carbide semiconductor device of the first embodiment.

Like in the device described in the first embodiment, in the silicon carbide semiconductor device of this embodiment, bipolar operation in the terminal region can be suppressed during the free-wheeling operation of the MOSFET. Further, a voltage generated on the second well region 31 can be reduced during the turn-off operation and the turn-on operation to reduce the occurrence of insulation breakdown of the insulating film on the second well region 31.

Additionally, compared to the silicon carbide semiconductor device of the first embodiment, the silicon carbide semiconductor device of this embodiment can be manufactured easily.

Fourth Embodiment

In the example described in the third embodiment, the low-resistance silicon carbide conductive layer 45 of the first conductivity type is formed in the upper layer area of the second well region 31. Alternatively, the silicon carbide conductive layer 45 may be buried in the second well region 31. The other structure will not be described in detail as it is the same as that in the third embodiment.

Figure 12:
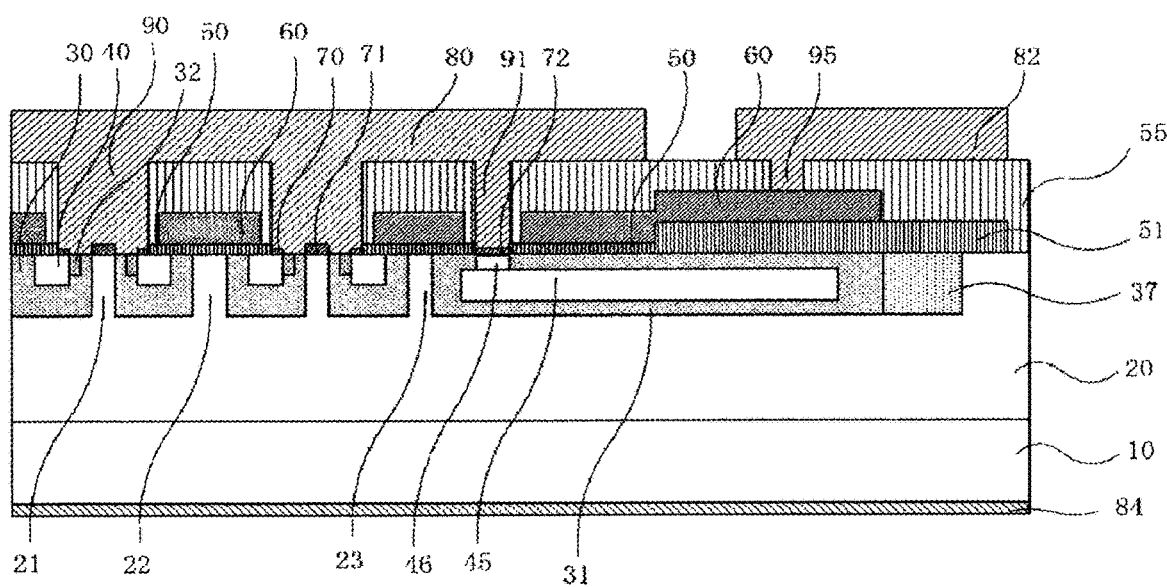
FIG. 12 is a schematic sectional view of a silicon carbide semiconductor device according to a fourth embodiment of the invention.

FIG. 12 is a schematic sectional view of a silicon carbide semiconductor device of a fourth embodiment schematically showing a cross section in the part a-a' from the source electrode 80 to the gate line 82 at an outer peripheral part of the silicon carbide semiconductor device in FIG. 1 referred to in the description of the first embodiment.

In a terminal region of FIG. 12, the silicon carbide conductive layer 45 is formed at a central area in a depth direction of the second well region 31 of the second conductivity type. The silicon carbide conductive layer 45 is connected with a second ohmic electrode 72 through a connection region 46 of the first conductivity type.

The connection region 46 of the first conductivity type may be formed by ion implantation together with formation of the source region 40. The silicon carbide conductive layer 45 may be formed by implanting ions deeply.

In the silicon carbide semiconductor device of this embodiment, the silicon carbide conductive layer 45 is formed inside the second well region 31. This can increase the area of a pn diode formed between the silicon carbide conductive layer 45 and the second well region 31, thereby allowing increase in a depletion layer capacity formed between the silicon carbide conductive layer 45 and the second well region 31.

As a result, a voltage generated on the second well region 31 can be reduced further to reduce the occurrence of insulation breakdown of the insulating film further formed on the second well region 31.

Fifth Embodiment

In the example described in the third embodiment, the low-resistance silicon carbide conductive layer 45 of the first conductivity type is formed in the upper layer area of the second well region 31. The silicon carbide conductive layer 45 may have a lower surface with recesses and projections. The other structure will not be described in detail as it is the same as that in the third embodiment.

Figure 13:
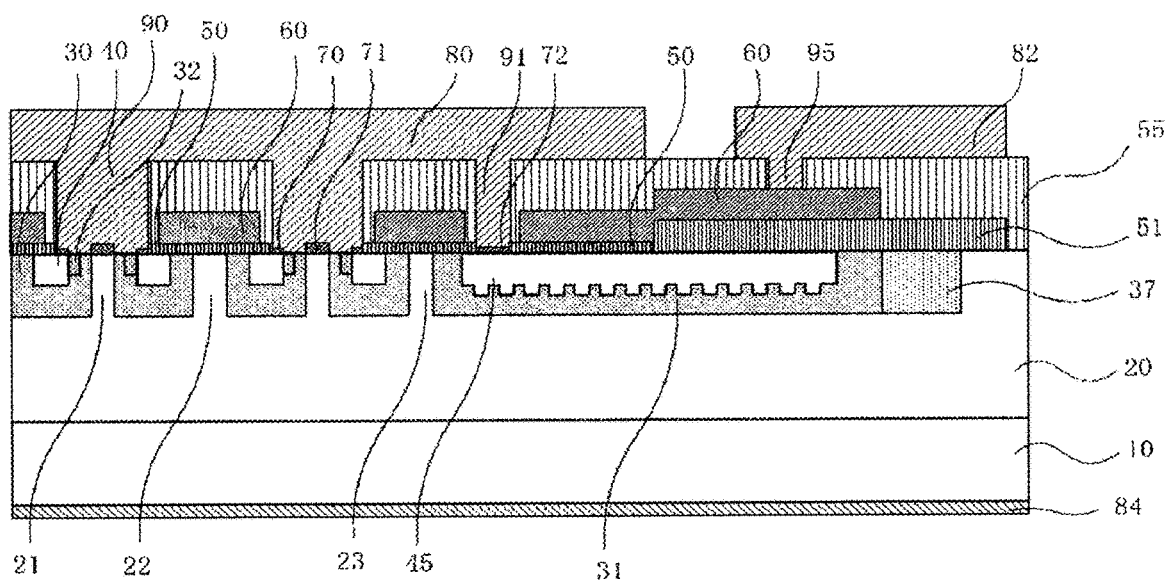
FIG. 13 is a schematic sectional view of a silicon carbide semiconductor device according to a fifth embodiment of the invention.

FIG. 13 is a schematic sectional view of a silicon carbide semiconductor device of a fifth embodiment schematically showing a cross section in the part a-a' from the source electrode 80 to the gate line 82 at an outer peripheral part of the silicon carbide semiconductor device in FIG. 1 referred to in the description of the first embodiment.

In a terminal region of FIG. 13, the silicon carbide conductive layer 45 has a lower surface where recesses and projections are formed at a connection with the second well region 31.

The recesses and projections at the lower surface of the silicon carbide conductive layer 45 may be formed before or after the ion implantation for forming the silicon carbide conductive layer 45 and by implanting ions through a predetermined ion implantation mask into a greater depth than the silicon carbide conductive layer 45.

In the silicon carbide semiconductor device of this embodiment, the presence of the recesses and projections formed at the lower surface of the silicon carbide conductive layer 45 makes it possible to increase the area of a pn diode formed between the silicon carbide conductive layer 45 and the second well region 31, thereby allowing increase in a depletion layer capacity formed between the silicon carbide conductive layer 45 and the second well region 31.

As a result, a voltage generated on the second well region 31 can be reduced further to reduce the occurrence of insulation breakdown of the insulating film further formed on the second well region 31.

Sixth Embodiment

In the terminal region of the silicon carbide semiconductor device of any one of the first to fifth embodiments, the second well region 31 does not have an ohmic contact with the source electrode 80, the second well region 31 has a region for Schottky connection, pn connection, or capacity coupling through an insulating film, and the source electrode 80 is in ohmic connection with this region. In addition to these, like the first well region 30 in the active region, a separation region of the first conductivity type may be formed inside the second well region 31 in a plane direction, and an electrode in Schottky connection with this separation region may be provided. The other structure will not be described in detail as it is the same as those in the first to fifth embodiments.

Figure 14:
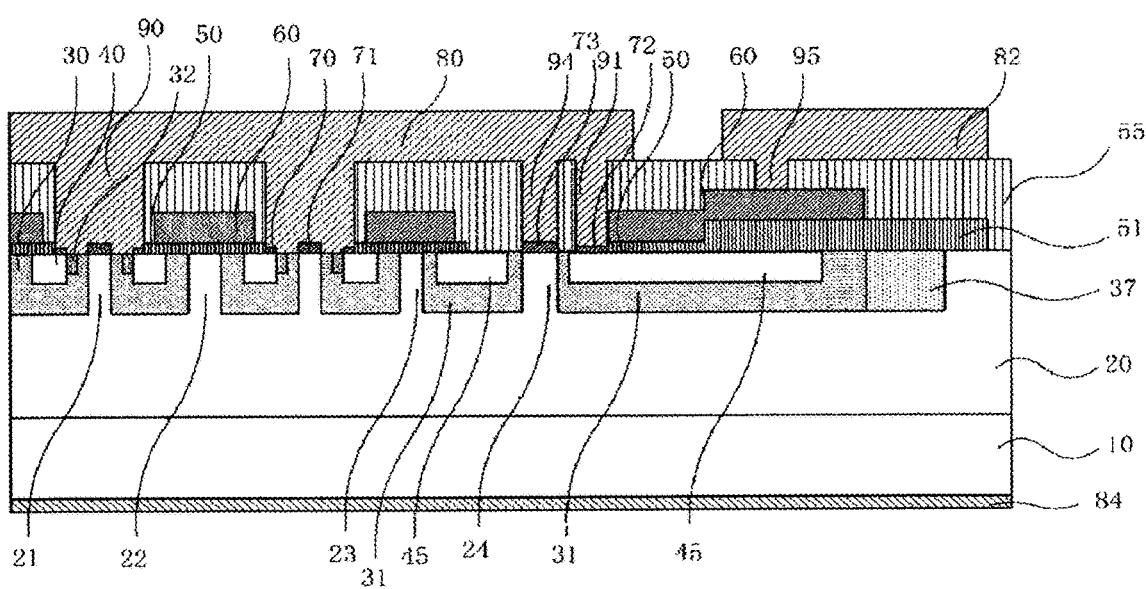
FIG. 14 is a schematic sectional view of a silicon carbide semiconductor device according to a sixth embodiment of the invention.

FIG. 14 is a schematic sectional view of a silicon carbide semiconductor device of a sixth embodiment schematically showing a cross section in the part a-a' from the source electrode 80 to the gate line 82 at an outer peripheral part of the silicon carbide semiconductor device in FIG. 1 referred to in the description of the first embodiment.

In a terminal region of FIG. 14, a fourth separation region 24 of the first conductivity type made of silicon carbide is formed on a plane inside the second well region 31 of the second conductivity type. A second Schottky electrode 73 in Schottky connection with the fourth separation region 24 is formed on the fourth separation region 24. The second Schottky electrode 73 is formed in a Schottky contact hole 94 within second well region. The other structure is the same as that in the third embodiment.

Figure 15:
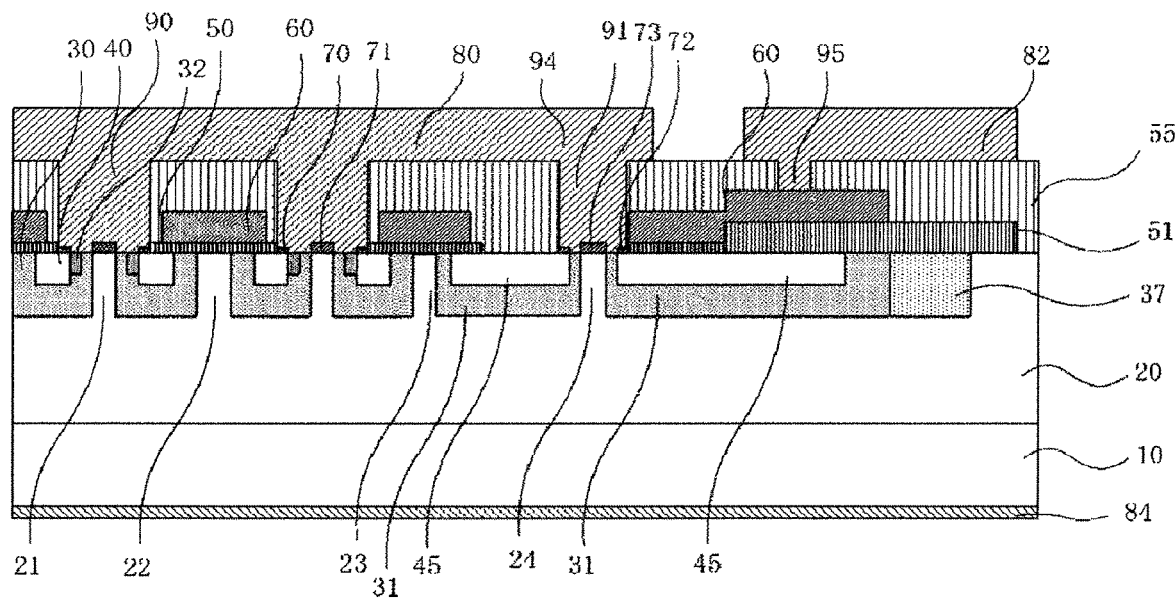
FIG. 15 is a schematic sectional view of the silicon carbide semiconductor device according to the sixth embodiment of the invention.
Figure 16:
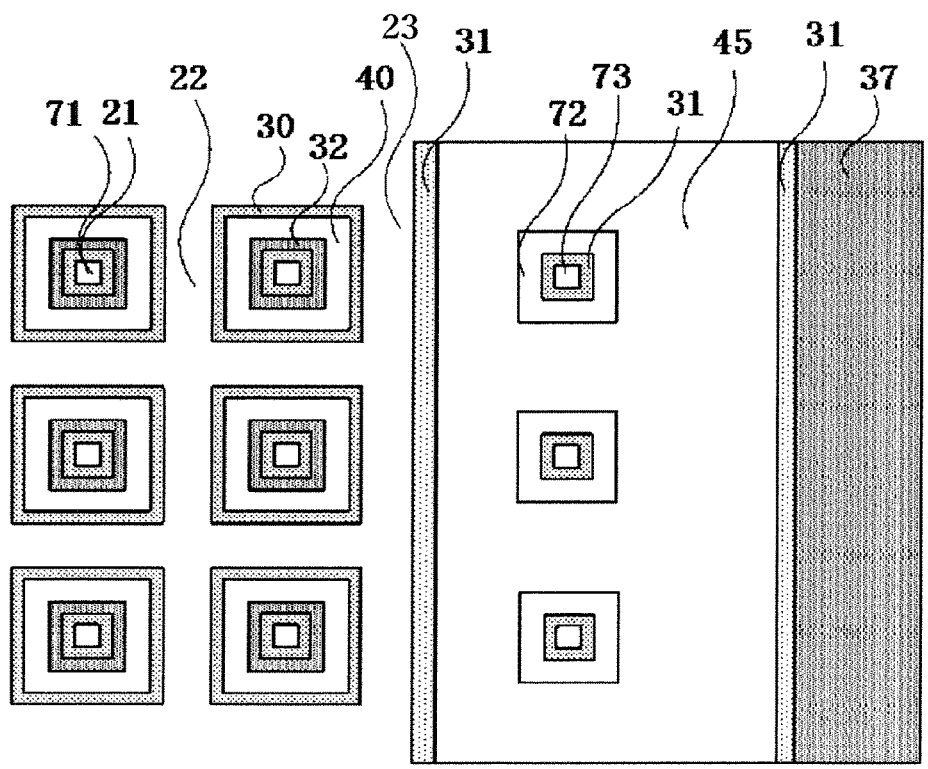
FIG. 16 is a schematic plan view of the silicon carbide semiconductor device according to the sixth embodiment of the invention.

As shown in the schematic sectional view and the schematic plan view of FIGS. 15 and 16 respectively, the conductive layer contact hole 91 connecting the conductive layer 47 or the silicon carbide conductive layer 45 of any of the first to fifth embodiments with the source electrode 80, and the Schottky contact hole 94 within second well region connecting the second Schottky electrode 73 on the fourth separation region 24 with the source electrode 80, may be formed using the same contact hole.

As shown in FIGS. 15 and 16, by using the same contact hole for forming the conductive layer contact hole 91 connecting the conductive layer 47 or the silicon carbide conductive layer 45 with the source electrode 80, and the Schottky contact hole 94 within second well region connecting the second Schottky electrode 73 on the fourth separation region 24 with the source electrode 80, the area of the contact hole can be reduced. Further, by forming the fourth separation region 24 of the first conductivity type further in the second well region 31 and forming the second Schottky electrode 73 in Schottky connection with the fourth separation region 24, performance of suppressing passage of a bipolar current can be improved further during the freewheeling operation.

In the silicon carbide semiconductor device of this embodiment, the structure in Schottky connection with the drift layer 20 is provided further on a plane inside the second well region 31, like in the active region. This makes it possible to reduce a bipolar current further flowing in the second well region 31 in the terminal structure.

In the example described in this embodiment, the structure having Schottky connection with the drift layer 20 and being formed in the second well region 31 of the second conductivity type is applied to the third embodiment. Applying this structure to the other embodiments certainly achieves comparable effect.

Seventh Embodiment

In the terminal region of the silicon carbide semiconductor device of any one of the first to sixth embodiments, the impurity concentration in the second well region 31 in a plane lateral direction has not particularly been mentioned.

The second well region 31 is characterized in that the second well region 31 includes an electric field relaxing layer 33 of the second conductivity type formed in an upper layer area of a part on which the gate electrode 60 is formed across the gate insulating film 50 and having a lower impurity concentration than the other second well region 31. The other structure will not be described in detail as it is the same as those in the first to sixth embodiments.

Figure 17:
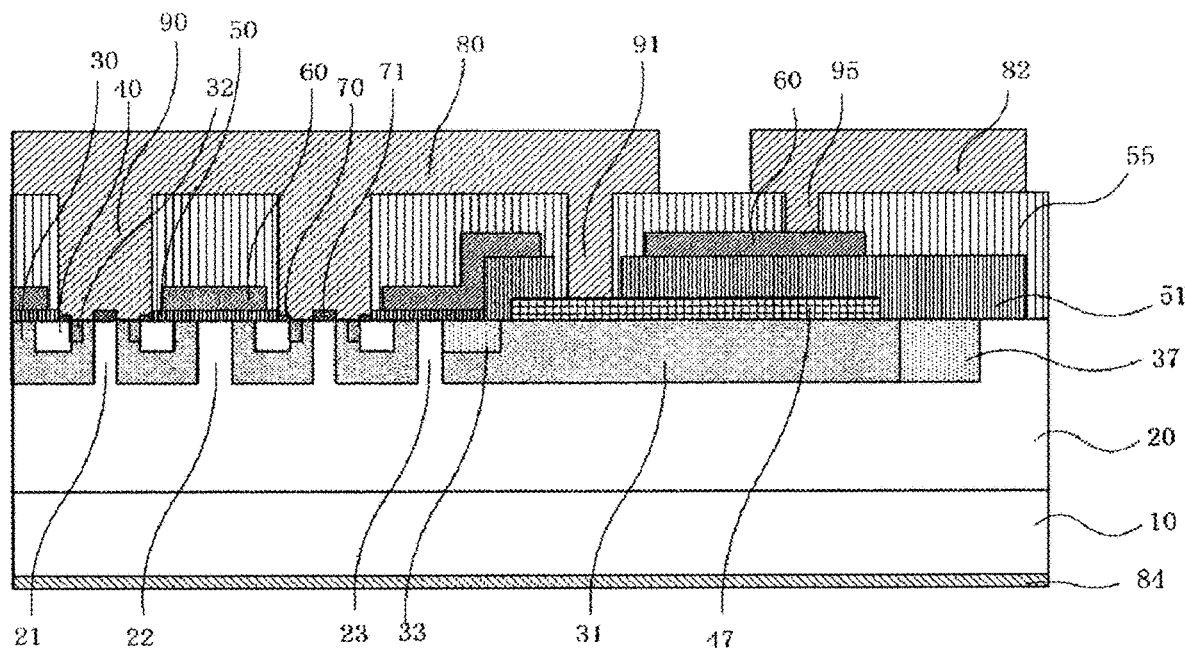
FIG. 17 is a schematic sectional view of a silicon carbide semiconductor device according to a seventh embodiment of the invention.

In a terminal region of FIG. 17, the second well region 31 of the second conductivity type includes an electric field relaxing layer 33 of the second conductivity type formed in an upper layer area of a part on which the gate electrode 60 is formed across the gate insulating film 50 and having a lower impurity concentration than the other second well region 31. The structure of FIG. 17 shows an example resulting from application of the electric field relaxing layer 33 to the structure of the third embodiment.

The impurity concentration in the electric field relaxing layer 33 may be set at half or less of the impurity concentration in the second well region 31, for example.

In a silicon carbide semiconductor device of a seventh embodiment, a depletion layer is formed between the gate insulating film 50 and the electric field relaxing layer 33 by a voltage resulting from residual charge generated in the second well region 31 during turn-on.

In the absence of the electric field relaxing layer 33, a depletion layer is formed between the gate insulating film 50 and the second well region 31. Meanwhile, by the presence of the electric field relaxing layer 33 in the silicon carbide semiconductor device of this embodiment, the width of this depletion layer is increased considerably. This makes it possible to considerably reduce electric field to be applied to the gate insulating film 50 by a voltage generated from residual charge in the second well region 31 during turn-on, so that the reliability of the gate insulating film 50 can be improved more significantly.

The electric field relaxing layer 33 in the silicon carbide semiconductor device of this embodiment can be formed by implanting n-type or p-type ions using a predetermined mask before or after the ion implantation for forming the second well region 31.

The p-type ions are implanted by a method of implanting the ions first into a deep region for forming the second well region 31, and then implanting the ions into a shallow region using a mask having an opening corresponding to a region other than a region to become the electric field relaxing layer 33. In this case, a retrograde profile of the ion implantation into the second well region 31 having a peak at a deep region produces a low impurity concentration in a shallow region contacting the gate insulating film 50 to make this shallow region as it is function as the electric field relaxing layer 33.

Eighth Embodiment

In the terminal region of the silicon carbide semiconductor device of any one of the first to seventh embodiments, the structure mainly described is that the first well region 30 in the active region and the second well region 31 in the terminal structure are separated, in principle, and the second well region 31 is not in ohmic connection with the source electrode 80. In an eighth embodiment, the second well region 31 in the terminal structure connects with a part of the first well region 30 through an auxiliary connection region 34. The other structure will not be described in detail as it is the same as those in the first to seventh embodiments.

Figure 18:
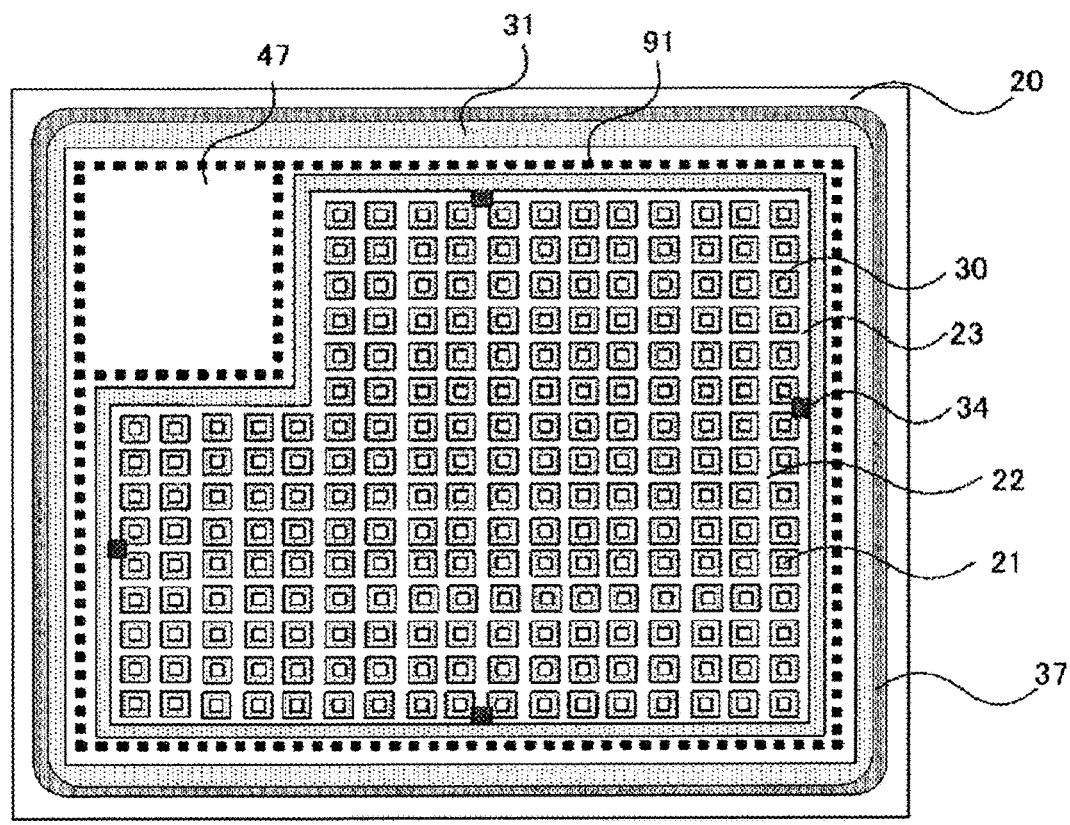
FIG. 18 is a schematic plan view of a silicon carbide semiconductor device according to an eighth embodiment of the invention.

FIG. 18 is a schematic plan view of a silicon carbide semiconductor device of this embodiment. In FIG. 18, the first well region 30 in the active region and the second well region 31 in the terminal region are connected with each other through the auxiliary connection region 34 of the second conductivity type. FIG. 18 shows a case resulting from application of the auxiliary connection region 34 to the first embodiment.

The auxiliary connection region 34 of the second conductivity type may be formed together with formation of the second well region 31 using a different ion implantation mask.

If the first well region 30 in the active region and the second well region 31 in the terminal structure are completely isolated from each other to place the second well region 31 in a completely floating state, the second well region 31 may be charged up under some conditions or in some structures to cause a likelihood of insulation breakdown of the insulating film on the second well region 31.

In the silicon carbide semiconductor device of this embodiment, as the second well region 31 is connected through the auxiliary connection region 34, insulation breakdown of the insulating film on the second well region 31 can be avoided more reliably to achieve improved reliability.

In this case, a current passing through the auxiliary connection region 34 without passing through the third separation region 23 flows in a region near the auxiliary connection region 34 near the center of each side of the silicon carbide semiconductor device shown in FIG. 18. This makes it likely that a breakdown voltage will be degraded. In response to this, in the region near the auxiliary connection region 34 around each corner of the silicon carbide semiconductor device shown in FIG. 18, a current flows a long distance in a plane lateral direction in the second well region 31, as described in the first embodiment. This causes voltage drop resulting from a sheet resistance in the second well region 31 to suppress passage of a bipolar current.

In FIG. 6 regarding the first embodiment, the first well region 30 and the second well region 31 are connected with each other at many positions. In this embodiment, a position of the connection between the first well region 30 and the second well region 31 is limited to reduce a part where a breakdown voltage may be degraded. This functions to limit breakdown voltage degradation to be caused by flow of a bipolar current in the second well region 31.

As described above, in the silicon carbide semiconductor device of this embodiment, a likelihood of insulation breakdown to be caused by the occurrence of a floating state in the second well region 31 can be reduced, while reliability reduction to be caused by passage of a bipolar current in the second well region 31 can be minimized.

A region with the auxiliary connection region 34 is preferably shorter than the length of the third separation region 23. For example, this region may be one tenth of less of the length of the third separation region 23. By doing so, a likelihood of the occurrence of breakdown voltage degradation is reduced to about one tenth or less, so that the reliability of an element can be improved to a greater extent.

Ninth Embodiment

The first to eighth embodiments are characterized in that the second well region 31 formed in the MOSFET terminal region includes the conductive layer contact hole 91. Even in the absence of the conductive layer contact hole 91 on the second well region 31, the effect of the present invention is still achieved if the conductive layer 47 formed near the second well region 31 is in ohmic connection with the source electrode 80 at any position and the second well region 31 is connected at a high resistance as viewed from the source electrode 80. Here, the conductive layer 47 has an area half or more of the area of the second well region 31 below the gate pad 81. The other structure will not be described in detail as it is the same as that in the first embodiment, etc.

Figure 19:
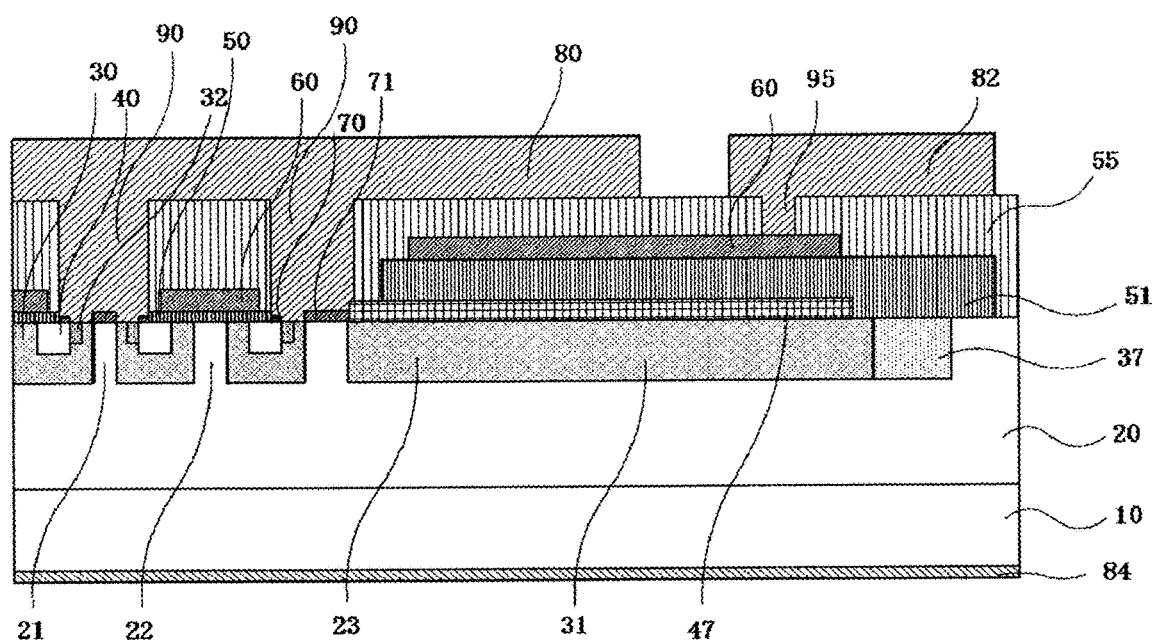
FIG. 19 is a schematic sectional view of a silicon carbide semiconductor device according to a ninth embodiment of the invention.

FIG. 19 is a schematic sectional view showing a terminal region in a silicon carbide semiconductor device according to a ninth embodiment. As shown in FIG. 19, in the silicon carbide semiconductor device of this embodiment, a connection with the conductive layer 47 is formed in a part of the first well region contact hole 90 and at a position closer to the active region than the second well region 31 in the terminal structure. This structure does not require formation of a particular contact hole in the second well region 31 and can increase the resistance of connection of the source electrode with the second well region 31. Further, the conductive layer 47 at a low sheet resistance to be in the same potential as the ohmic electrode 70 is formed on the second well region 31. Forming the conductive layer 47 widely in a lateral direction in a cross section makes it possible to reduce a resistance in the second well region 31 in the lateral direction in a cross section. Thus, even in high-speed switching, the silicon carbide semiconductor device of this embodiment can still reduce a voltage generated on the second well region 31 during the turn-off operation and the turn-on operation. This can reduce the occurrence of insulation breakdown of the insulating film on the second well region 31 and can suppress passage of a bipolar current during free-wheeling operation.

Figure 20:
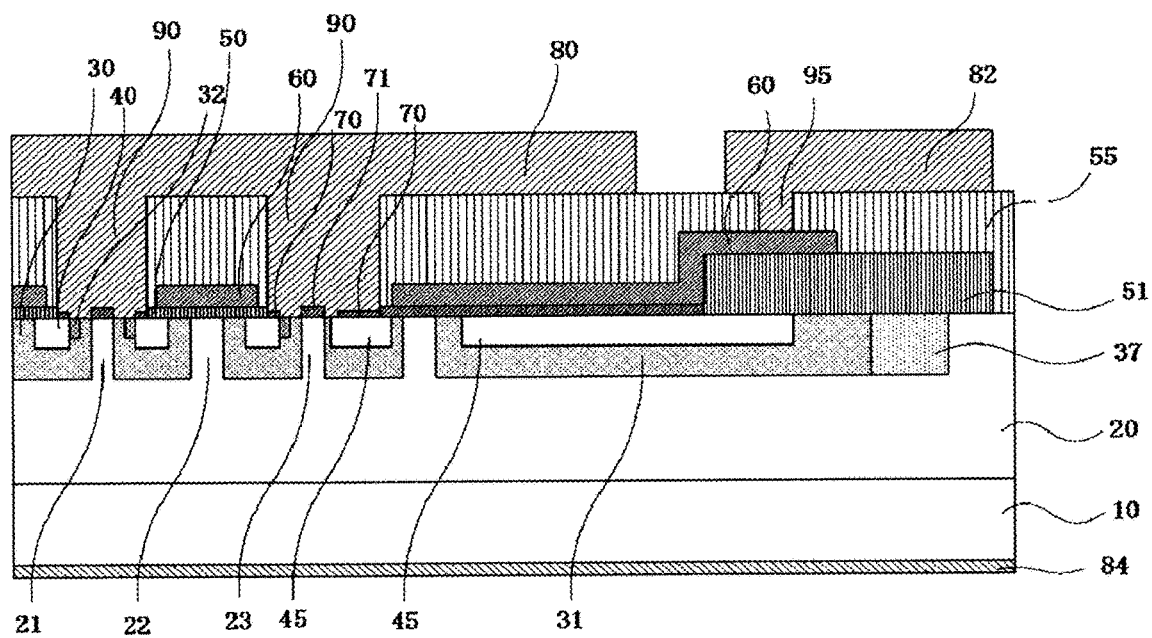
FIG. 20 is a schematic sectional view of the silicon carbide semiconductor device according to the ninth embodiment of the invention having a different structure.
Figure 21:
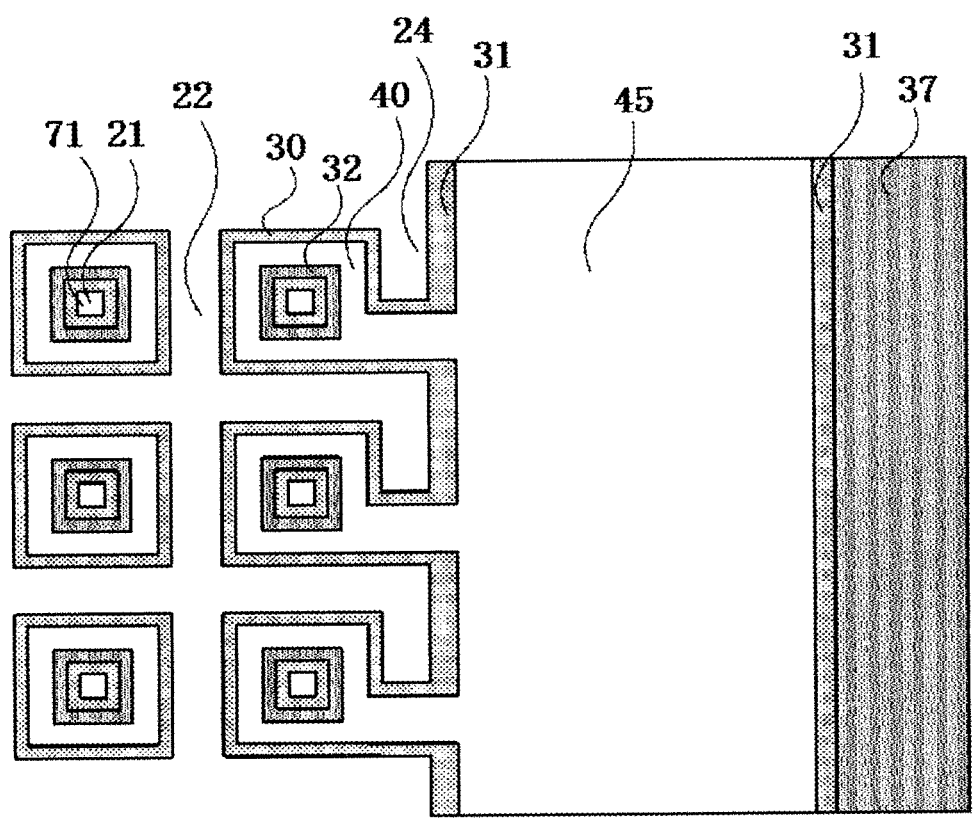
FIG. 21 is a schematic plan view of the silicon carbide semiconductor device according to the ninth embodiment of the invention having a different structure.

FIG. 20 is a schematic sectional view of a silicon carbide semiconductor device according to a modification of this embodiment. FIG. 21 is a schematic plan view of the silicon carbide semiconductor device according to the modification of this embodiment. In FIGS. 20 and 21, the low-resistance n-type silicon carbide conductive layer 45 formed in the upper layer area of the second well region 31 is partially connected in a plane direction with the source region 40 formed in an upper layer area of the first well region 30 at the outermost periphery of the active region. Further, the second well region 31 is connected with the first well region 30 in a plane direction.

The source region 40 in the first well region 30 is in ohmic connection with the source electrode 80 through the ohmic electrode 70 in the first well region contact hole 90. This forms ohmic connection of the silicon carbide conductive layer 45 formed in the upper layer area of the second well region 31 with the source electrode 80 in a low-resistance and ohmic fashion. Thus, even in high-speed switching, the silicon carbide semiconductor device of this embodiment can still reduce a voltage generated on the second well region 31 during the turn-off operation and the turn-on operation.

The first well region 30 to be in the same potential as the source electrode 80 and the second well region 31 are connected through a p-type semiconductor at a relatively high resistance. This can suppress flow of a bipolar current in the second well region 31 during switching.

Figure 22:
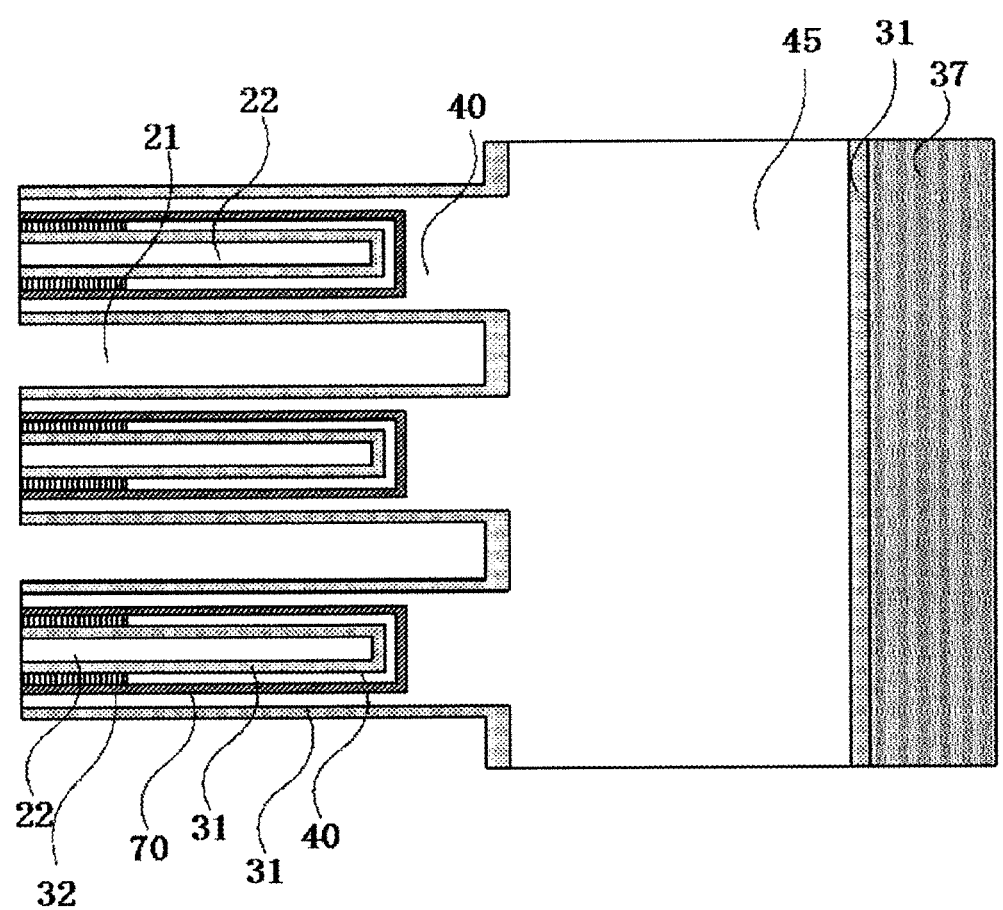
FIG. 22 is a schematic plan view of the silicon carbide semiconductor device according to the ninth embodiment of the invention having a different structure.

As shown in the schematic plan view of FIG. 22, in the silicon carbide semiconductor device of this embodiment, the first well region 30 in the active region formed into a stripe pattern may be connected with the second well region 31 in the terminal region, and the source region 40 in the first well region 30 may be connected with the silicon carbide conductive layer 45 in the second well region 31.

Also in the structure shown in FIG. 22, ohmic contact with the source electrode 80 is not formed from the second well region 31. Further, the silicon carbide conductive layer 45 formed in a wide range in the upper layer area of the second well region 31 is connected in a low-resistance and ohmic fashion with the source electrode 80 through the source region 40 in the first well region 30. Additionally, the second well region 31 and the first well region 30 are connected with each other and this connection is formed by p-type semiconductor at a relatively high resistance, making it possible to suppress flow of a bipolar current in the second well region 31 during switching. Thus, the silicon carbide semiconductor device of this structure can also reduce a voltage generated on the second well region 31 during high-speed switching to allow reduction of the occurrence of insulation breakdown of the insulating film on the second well region 31. Further, passage of a bipolar current during free-wheeling operation can be suppressed.

In the silicon carbide semiconductor device of this embodiment, it can be said that one contact hole functions both as the conductive layer contact hole 91 and the first well region contact hole 90 in the silicon carbide semiconductor device of any of the first to eighth embodiments.

The silicon carbide semiconductor device of this embodiment can be manufactured through process basically the same as that for manufacturing the silicon carbide semiconductor device of any of the first to eighth embodiments.

Tenth Embodiment

In the first to ninth embodiments, the conductive layer 47 or the silicon carbide conductive layer 45 on the second well region 31 formed in the MOSFET terminal region does not directly contact the drift layer 20. By contrast, in a silicon carbide semiconductor device of a tenth embodiment, an n-type separation region is formed in a part of the second well region 31 and this separation region is in Schottky connection with the conductive layer 47 formed on this separation region. The other structure will not be described in detail as it is the same as those in the foregoing embodiments.

Figure 23:
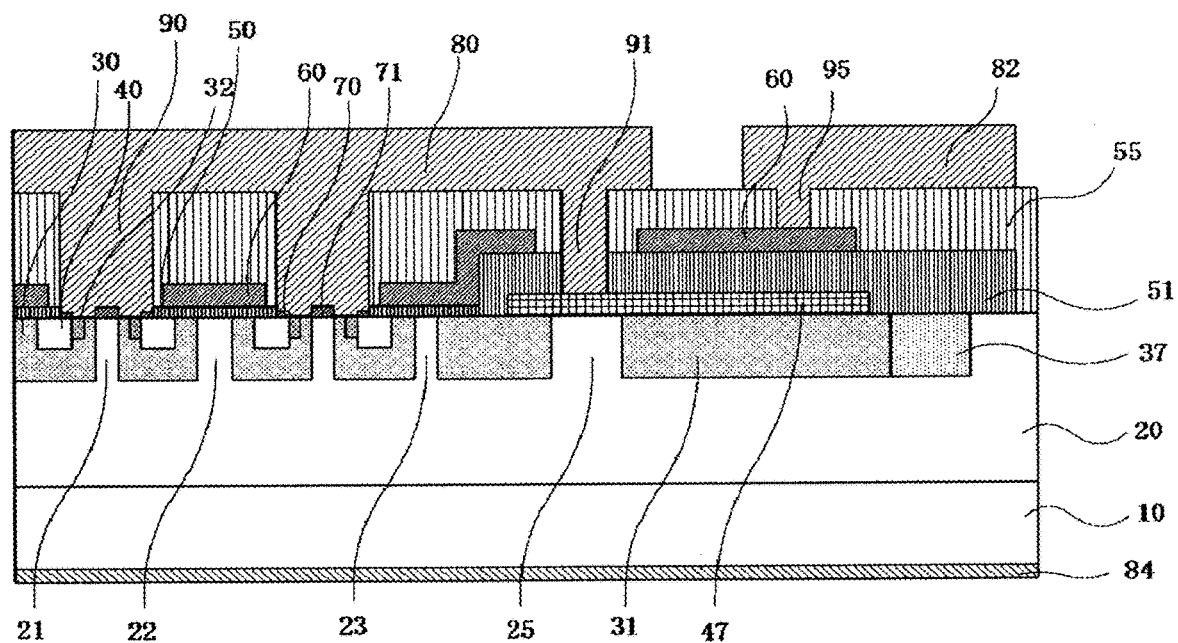
FIG. 23 is a schematic sectional view of a silicon carbide semiconductor device according to a tenth embodiment of the invention.

This embodiment is intended to enhance the effect of the present invention. In this embodiment, as shown in the schematic sectional view of FIG. 23, an n-type fifth separation region 25 is provided in the second well region 31 under the conductive layer 47, and the fifth separation region 25 continuous with the drift layer 20 and the conductive layer 47 are in direct Schottky connection with each other. In this embodiment, with any size of the conductive layer contact hole 91, the fifth separation region 25 of a desired size and the fifth separation regions 25 of a desired number can be formed in the second well region 31. This makes it possible to enhance the effect of suppressing passage of a bipolar current in the terminal region further.

The fifth separation region 25 may have an impurity concentration same as or different from that in the drift layer 20.

By the presence of the conductive layer 47 formed in a wide range on the second well region 31, a displacement current generated in the second well region 31 is allowed to flow into the source electrode at a low resistance through a large depletion layer capacity between the second well region 31 and the conductive layer 47. This makes it possible to reduce a voltage generated in the second well region 31 during high-speed switching to reduce the occurrence of insulation breakdown of the insulating film on the second well region 31.

The silicon carbide semiconductor device of this embodiment can be manufactured through process basically the same as that for manufacturing the silicon carbide semiconductor device of any of the first to eighth embodiments, while only a resist pattern for ion implantation for forming the second well region 31 is required to be changed.

In this embodiment, the conductive layer 47 may be made of a material allowing Schottky connection with both the drift layer 20 of the first conductivity type and the second well region 31 of the second conductivity type. For example, the conductive layer 47 may be made of n-type or p-type polycrystalline silicon or metal such as Al or Ti.

In the descriptions given in the first to tenth embodiments, the first conductivity type is the n type and the second conductivity type is the p type. However, conductivity types are not limited to these. Comparable effect is still achieved with the first conductivity type being the p type and the second conductivity type being the n type. Additionally, while N is used as the n-type (first conductivity type) impurities, phosphorus or arsenic is also applicable. While Al is used as the p-type (second conductivity type) impurities, boron or gallium is also applicable.

In the MOSFET described in any of the first to tenth embodiments, the gate insulating film 50 is not always required to be an oxide film such as silicon oxide but it may also be an insulating film other than an oxide film, or a combination of an insulating film other than an oxide film and an oxide film. While silicon oxide resulting from thermal oxidation of silicon carbide is used for forming the gate insulating film 50, the gate insulating film 50 may also be made of silicon oxide in a deposited film formed by CVD process. Further, the present invention is also applicable to an MOSFET having a super junction structure.

The device described in any of the foregoing embodiments is the MOSFET with the gate insulating film 50. Meanwhile, the present invention is applicable to any unipolar device. For example, the present invention is further applicable to a junction FET (JFET) or a metal-semiconductor field effect transistor (MESFET) without the gate insulating film 50.

While the ohmic electrode 70 and the first Schottky electrode 71 belonging to the source side are prepared separately in the foregoing embodiments, they may be formed continuously using the same material or may be formed continuously using different materials.

The first Schottky electrode 71 and the second Schottky electrode 73 may be formed using the same material or different materials.

In the foregoing embodiments, various examples have been given for describing a crystal structure, a plane direction of a main surface, an off angle, a condition for each implantation, etc. However, applicability should not be limited to the numerical ranges given in these examples.

Eleventh Embodiment

In an eleventh embodiment, the silicon carbide semiconductor device according to any of the first to tenth embodiments is applied to a power converter. While the applicability of the present invention is not limited to a particular power converter, the present invention described in the following eleventh embodiment is applied to a three-phase inverter.

Figure 24:
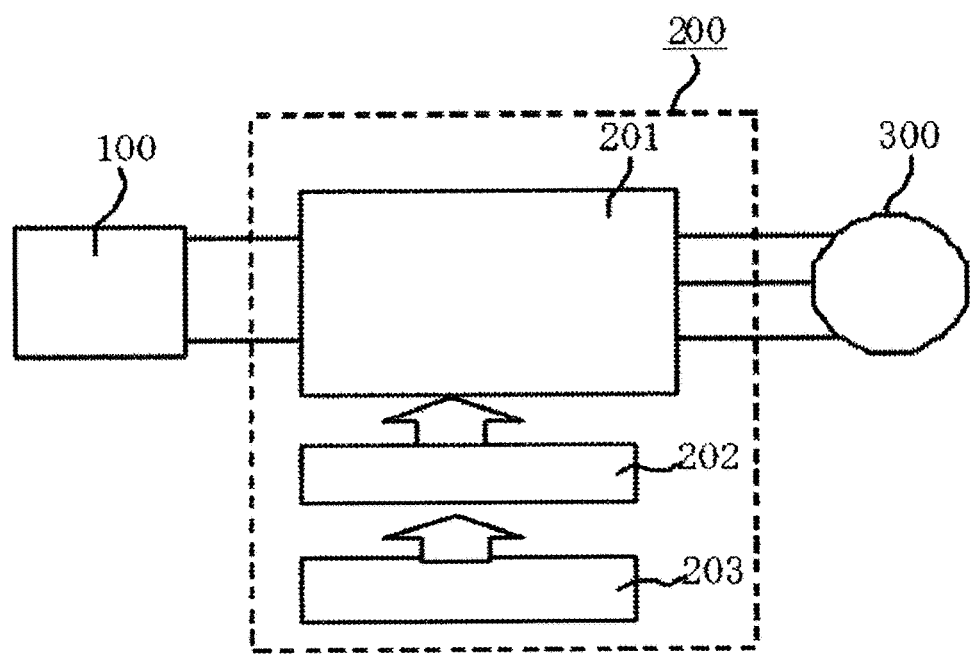
FIG. 24 is a schematic view showing the structure of a power converter according to an eleventh embodiment of the invention.

FIG. 24 is a block diagram showing the structure of a power converter system using the power converter according to this embodiment.

The power converter system shown in FIG. 24 includes a power supply 100, a power converter 200, and a load 300. The power supply 100 is a DC power supply and supplies DC power to the power converter 200. The power supply 100 can be configured using various types of power supplies. For example, the power supply 100 can be configured using a DC system, a solar cell, a battery, or a rectifier circuit or an AC/DC converter connected with an AC system. The power supply 100 may also be configured using a DC/DC converter that converts DC power output from a DC system to predetermined power.

The power converter 200 is a three-phase inverter connected between the power supply 100 and the load 300. The power converter 200 converts DC power supplied from the power supply 100 to AC power, and supplies the AC power to the load 300. As shown in FIG. 24, the power converter 200 includes a main converter circuit 201 that converts DC power to AC power and outputs the AC power, a drive circuit 202 that outputs a drive signal for driving each switching element in the main converter circuit 201, and a control circuit 203 that outputs a control signal for controlling the drive circuit 202 to the drive circuit 202.

The load 300 is a three-phase motor driven by the AC power supplied from the power converter 200. The load 300 is not limited to particular purpose but is a motor installed on various types of electrical equipment. For example, the load 300 is used as a motor for a hybrid vehicle or an electric vehicle, a railway vehicle, an elevator, or an air conditioner.

The power converter 200 will be described in detail below. The main converter circuit 201 includes a switching element and a free-wheeling diode (not shown in the drawings). By the switching of the switching element, DC power supplied from the power supply 100 is converted to AC power, and the AC power is supplied to the load 300. Various specific circuit configurations are applicable to the main converter circuit 201. Among those, the main converter circuit 201 according to this embodiment is a two-level three-phase full-bridge circuit that can be configured using six switching elements, and six free-wheeling diodes connected inverse-parallel to corresponding ones of the switching elements. The silicon carbide semiconductor device according to any one of the foregoing first to sixth embodiments is applied to each switching element in the main converter circuit 201. Two switching elements of the six switching elements are connected in series to form an upper arm and a lower arm. Each upper arm and a corresponding lower arm form each phase (U phase, V phase, W phase) of the full-bridge circuit. An output terminal of each upper arm and a corresponding lower arm, namely, three output terminals of the main converter circuit 201 are connected with the load 300.

The drive circuit 202 generates a drive signal for driving a switching element in the main converter circuit 201, and supplies the generated drive signal to a control electrode of the switching element in the main converter circuit 201. More specifically, in response to a control signal from the control circuit 203 described later, the drive circuit 202 outputs a drive signal for bringing the switching element in an ON state and a drive signal for bringing the switching element in an OFF state to the control electrode of the switching element. To maintain the switching element in the ON state, the drive signal is a voltage signal (ON signal) at the threshold voltage of the switching element or more. To maintain the switching element in the OFF state, the drive signal is a voltage signal (OFF signal) at the threshold voltage of the switching element or less.

The control circuit 203 controls a switching element in the main converter circuit 201 so as to supply intended power to the load 300. More specifically, the control circuit 203 calculates time (ON time) when each switching element in the main converter circuit 201 is to be in the ON state based on the power to be supplied to the load 300. For example, the control circuit 203 can control the main converter circuit 201 by means of PWM control of modulating the ON time of the switching element in response to a voltage to be output. Then, the control circuit 203 outputs a control command (control signal) to the drive circuit 202 so as to output an ON signal to a switching element to be in the ON state and output an OFF signal to a switching element to be in the OFF state at a corresponding moment. In response to this control signal, the drive circuit 202 outputs an ON signal or an OFF signal as a drive signal to the control electrode of each switching element.

In the power converter of this embodiment, the silicon carbide semiconductor device of any of the first to tenth embodiments is applied as the switching element in the main converter circuit 201, thereby achieving a low-loss power converter with improved reliability of high-speed switching.

In the example described in this embodiment, the present invention is applied to the two-level three-phase inverter. However, the present invention should not be limited to this inverter but is applicable to various types of power converters. While the two-level power converter is described in this embodiment, a three-level or multilevel power converter is also applicable. For supply of power to a single-phase load, the present invention may be applied to a single-phase inverter. For supply of power to a DC load, for example, the present invention may be applied to a DC/DC converter or an AC/DC converter.

The power converter to which the present invention is applied is not limited to a power converter including a motor as the foregoing load but it may also be used as a power supply device for a discharge machine, a laser machine, an induction heating cooking appliance, or a non-contactor power feeding system, for example. The power converter is further applicable as a power conditioner for a solar power generation system or an electricity storage system, for example.

EXPLANATION OF REFERENCE SIGNS

10 Semiconductor substrate, 20 Drift layer, 21 First separation region, 22 Second separation region, 23 Third separation region, 24 Fourth separation region, 25 Fifth separation region, 30 First well region, 31 Second well region, 32 Contact region, 33 Electric field relaxing layer, 34 Auxiliary connection region, 37 JTE region, 40 Source region, 45 Silicon carbide conductive layer, 47 Conductive layer, 49 Channel epitaxial layer, 50 Gate insulating film, 51 Field insulating film, 53 Insulating layer, 55 Interlayer insulating film, 60 Gate electrode, 70 Ohmic electrode, 71 First Schottky electrode, 73 Second Schottky electrode, 80 Source electrode, source pad, 81 Gate pad, 82 Gate line, 84 Drain electrode, 90 First well region contact hole, 91 Conductive layer contact hole, 92 Second well region contact hole, 93 Schottky contact hole, 94 Schottky contact hole within second well region, 95 Gate contact hole, 100 Power supply, 200 Power converter, 201 Main converter circuit, 202 Drive circuit, 203 Control circuit, 300 Load

The invention claimed is:

1. A silicon carbide semiconductor device comprising:
a semiconductor substrate of a first conductivity type made of silicon carbide;
a drift layer of the first conductivity type formed on the semiconductor substrate;
multiple first well regions of a second conductivity type provided in a surface layer of the drill layer in a cross-sectional view;
a first separation region of the first conductivity type, which is a region separating each of the first well regions from each other in the cross-sectional view;
a source region of the first conductivity type formed in a surface layer area of each of the first well regions;
a first Schottky electrode provided on the first separation region and forming a Schottky junction with the first separation region;
an ohmic electrode provided in a first well region contact hole on each of the first well regions and in ohmic connection with each of the first well regions;
a gate insulating film formed on each of the first well regions;
a second well region of the second conductivity type provided in the surface layer of the drift layer separately from each of the first well regions;
a gate electrode formed on the gate insulating film on each of the first well regions and on an insulating film provided on the second well region;
a gate pad formed above the second well region and connected with the gate electrode;
a conductive layer formed above the bottom surface of the second well region so as not to be in ohmic connection with the second well region, the conductive layer being lower in sheet resistance than the second well region;
a source electrode connected with the first Schottky electrode, the ohmic electrode, and the conductive layer; and
a conductive layer contact hole forming an ohmic connection between the conductive layer and the source electrode, while the conductive layer and the second well region are not in ohmic connection.

2. The silicon carbide semiconductor device according to claim 1, wherein
each of the first well regions and the second well region are separated from each other.

3. The silicon carbide semiconductor device according to claim 1, wherein
the second well region is in ohmic connection with the source electrode through a second well region contact hole, and
the conductive layer contact hole and the second well region contact hole are separated from each other by 10 μm or more on a shortest path in the second well region in a plane direction.

4. The silicon carbide semiconductor device according to claim 1, wherein
the first well region contact hole is separated from the conductive layer contact hole by 10 μm or more on a shortest path in each of the first well regions or the second well region in a plane direction.

5. The silicon carbide semiconductor device according to claim 1, wherein
the conductive layer is a silicon carbide conductive layer made of silicon carbide of the first conductivity type formed in a surface layer area on the second well region.

6. The silicon carbide semiconductor device according to claim 5, wherein
the silicon carbide conductive layer is buried in the second well region in a depth direction in a cross section.

7. The silicon carbide semiconductor device according to claim 5, wherein
the silicon carbide conductive layer has a lower surface with recesses and projections.

8. The silicon carbide semiconductor device according to claim 1, wherein
the conductive layer is formed on a surface of the second well region, and
the conductive layer and the second well region are in Schottky connection with each other.

9. The silicon carbide semiconductor device according to claim 8, wherein
the conductive layer is made of polycrystalline silicon.

10. The silicon carbide semiconductor device according to claim 8, wherein
the conductive layer is in Schottky connection with a fifth separation region of the first conductivity type penetrating the second well region.

11. The silicon carbide semiconductor device according to claim 1, wherein
the conductive layer is formed over the second well region across an insulating layer.

12. The silicon carbide semiconductor device according to claim 1, wherein
the conductive layer is formed to extend over a width corresponding to a half or more of the width of the second well region in a lateral direction in a cross section.

13. The silicon carbide semiconductor device according to claim 1, comprising:
a fourth separation region of the first conductivity type provided inside the second well region in a plane direction; and
a second Schottky electrode provided on the fourth separation region and in Schottky connection with the fourth separation region, wherein
the second Schottky electrode is connected with the source electrode.

14. The silicon carbide semiconductor device according to claim 13, wherein
the second Schottky electrode and the conductive layer are connected in a contact hole same as a contact hole for the source electrode.

15. The silicon carbide semiconductor device according to claim 1, wherein
the conductive layer is formed below the gate pad or the gate electrode.

16. The silicon carbide semiconductor device according to claim 1, wherein
the gate electrode is provided over a part of the second well region across the gate insulating film,
the silicon carbide semiconductor device comprising an electric field relaxing layer lower in impurity concentration than the second well region and provided at the part where the second well region faces the gate electrode across the gate insulating film.

17. A power converter comprising:
a main converter circuit including the silicon carbide semiconductor device according to claim 1, and converting input power and outputting the converted power;
a drive circuit that outputs a drive signal for driving the silicon carbide semiconductor device to the silicon carbide semiconductor device; and
a control circuit that outputs a control signal for controlling the drive circuit to the drive circuit.

18. A silicon carbide semiconductor device comprising:
a semiconductor substrate of a first conductivity type made of silicon carbide;
a drift layer of the first conductivity type formed on the semiconductor substrate;
multiple first well regions of a second conductivity type provided in a surface layer of the drift layer in a cross-sectional view;
a first separation region of the first conductivity type, which is a region separating each of the first well regions from each other in the cross-sectional view;
a source region of the first conductivity type formed in a surface layer area of each of the first well regions;
a first Schottky electrode provided on the first separation region and forming a Schottky junction with the first separation region;
an ohmic electrode provided on each of the first well regions and in ohmic connection with each of the first well regions;
a gate insulating film formed on each of the first well regions;
a second well region of the second conductivity type provided in the surface layer of the drift layer to be continuous with at least one of the first well regions;
a gate electrode formed on the gate insulating film on each of the first well regions and on an insulating film provided on the second well region;
a gate pad formed above the second well region and connected with the gate electrode;
a conductive layer formed above the bottom surface of the second well region so as not to be in ohmic connection with the second well region, the conductive layer having an area half or more of the area of the second well region below the gate pad and being lower in sheet resistance than the second well region; and
a source electrode connected with the first Schottky electrode, the ohmic electrode, and the conductive layer, wherein
the second well region is in ohmic connection with the source electrode through a first well region contact hole on at least one of the first well regions.

19. The silicon carbide semiconductor device according to claim 18, wherein
the conductive layer is a silicon carbide conductive layer made of silicon carbide of the first conductivity type formed in a surface layer area on the second well region.

20. A power converter comprising:
a main converter circuit including the silicon carbide semiconductor device according to claim 18, and converting input power and outputting the converted power;
a drive circuit that outputs a drive signal for driving the silicon carbide semiconductor device to the silicon carbide semiconductor device; and
a control circuit that outputs a control signal for controlling the drive circuit to the drive circuit.

* * * * *